United States Patent
Yang et al.

(10) Patent No.: US 6,734,064 B2
(45) Date of Patent: May 11, 2004

(54) METHOD FOR FABRICATING READ ONLY MEMORY INCLUDING FORMING MASKING LAYERS WITH OPENINGS AND PRE-CODING THE CELL AND PERIPHERAL REGIONS

(75) Inventors: Tahorng Yang, Hsinchu (TW); Henry Chung, Taipei (TW); Cheng-Chen Calvin Hsueh, Taipei (TW); Ching-Yu Chang, Yilan Hsien (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 10/248,834

(22) Filed: Feb. 24, 2003

(65) Prior Publication Data

US 2003/0181013 A1 Sep. 25, 2003

(30) Foreign Application Priority Data

Mar. 20, 2002 (TW) ........................................ 91105278 A

(51) Int. Cl.[7] .................. H01L 21/336; H01L 21/8234; H01L 21/8236
(52) U.S. Cl. ........................ 438/257; 438/275; 438/276; 438/278
(58) Field of Search ................................ 438/257, 275, 438/276, 278

(56) References Cited

U.S. PATENT DOCUMENTS

| 5,545,580 A | * | 8/1996 | Sheng et al. | 438/276 |
| 6,020,241 A | * | 2/2000 | You et al. | 438/278 |

* cited by examiner

*Primary Examiner*—W. David Coleman
*Assistant Examiner*—William M. Brewster
(74) *Attorney, Agent, or Firm*—Jiang Chyun IP Office

(57) ABSTRACT

A fabrication method for a read only memory provides a substrate having a memory cell region and a periphery circuit region. A memory cell region has a memory cell array and the periphery circuit region has transistors. A precise layer having a plurality of first openings is formed in the memory cell region. The first openings are above the channel region of each memory cell in the memory cell array and the critical dimension of the first openings is identical. A mask layer having second openings and third openings is formed on the substrate. The second openings locate over a pre-coding memory cell region, and the third openings locate over the transistor gates. An ion implantation is performed to code the memory cell in the pre-coding memory cell region and to adjust the threshold voltage of the transistor, using the precise layer and the mask layer as a mask.

8 Claims, 20 Drawing Sheets

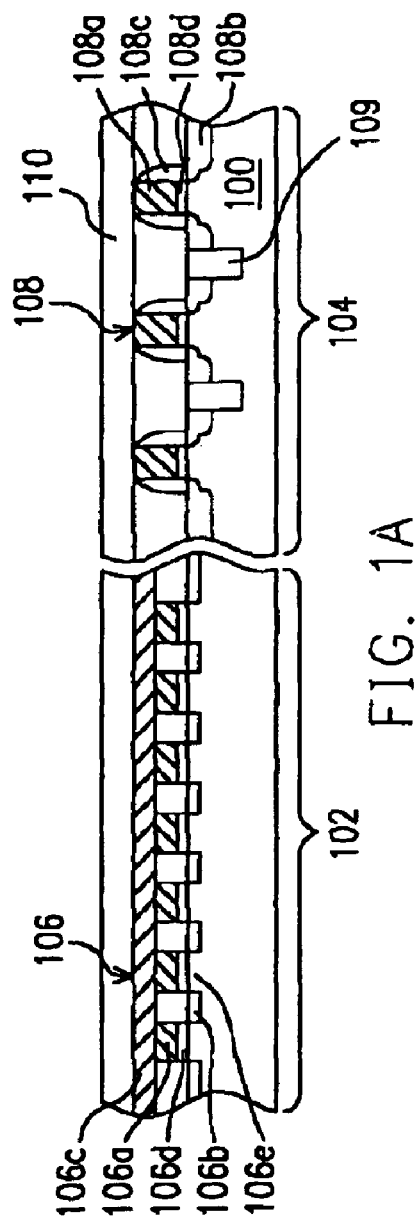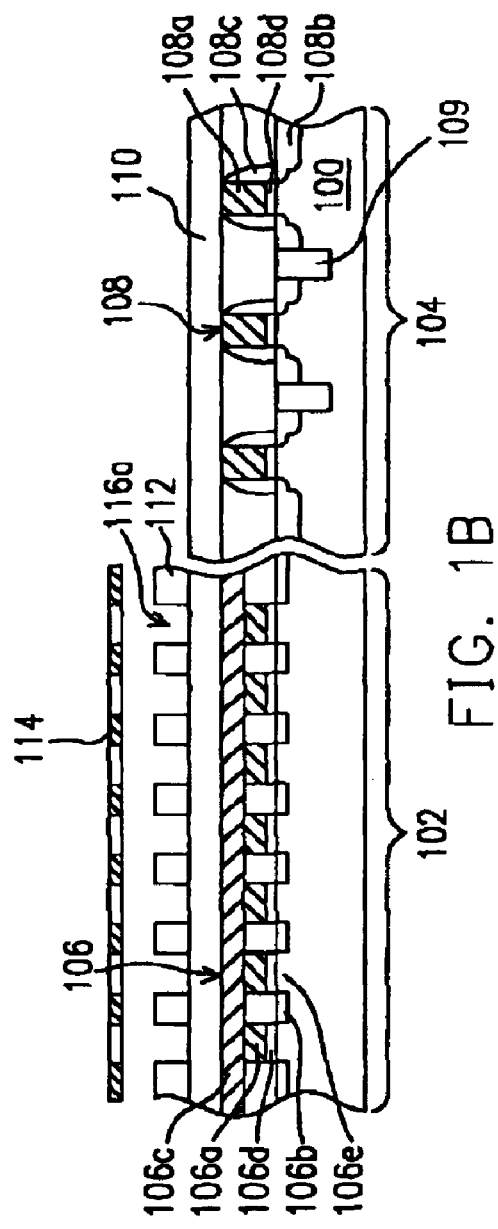
FIG. 1A
FIG. 1B

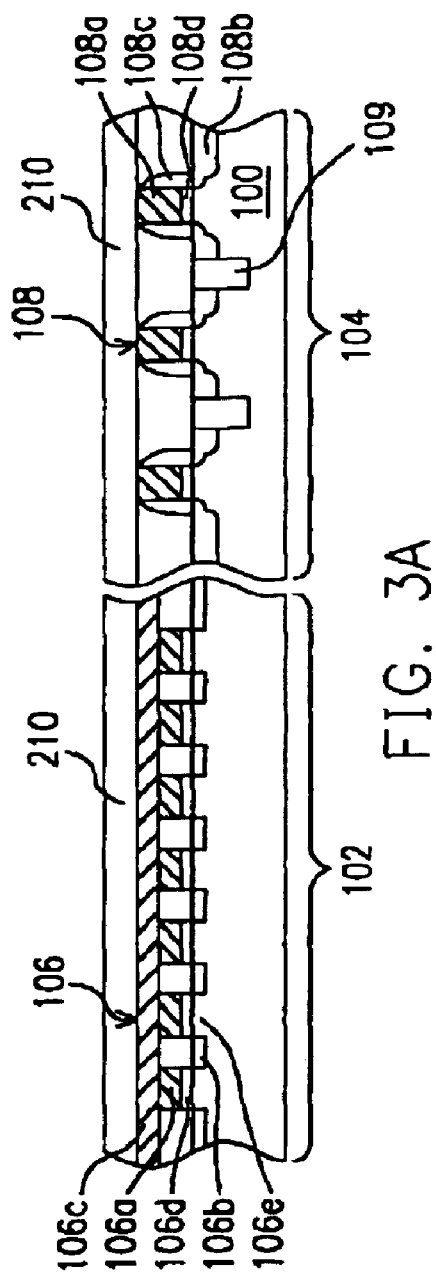
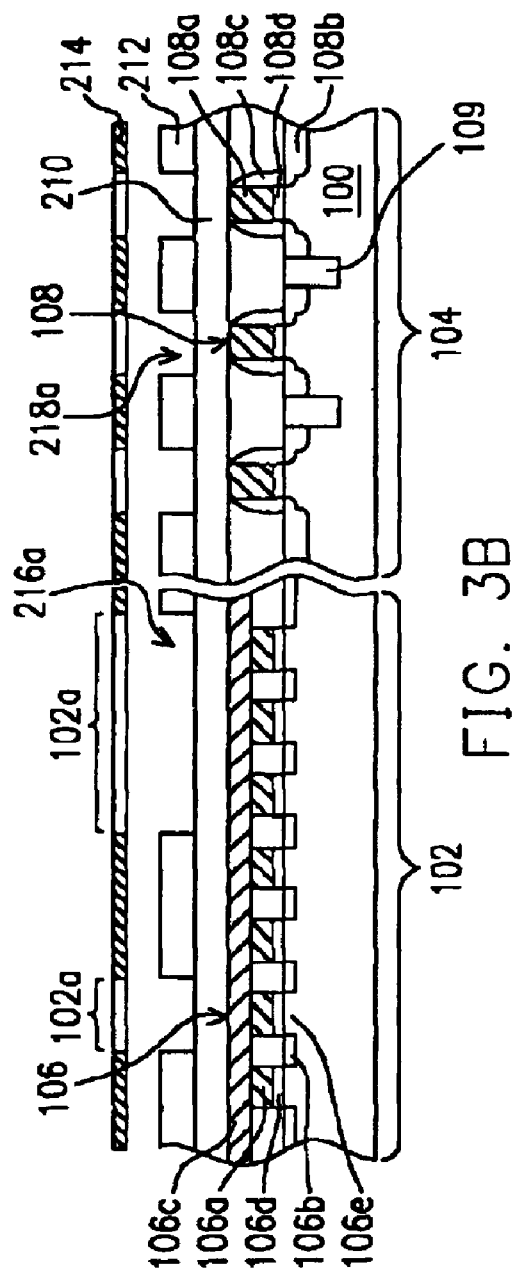
FIG. 3A
FIG. 3B

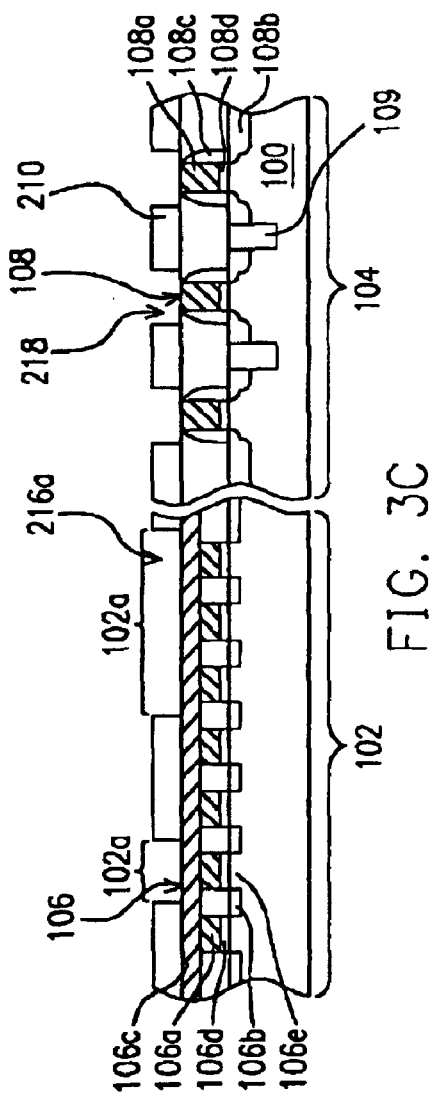
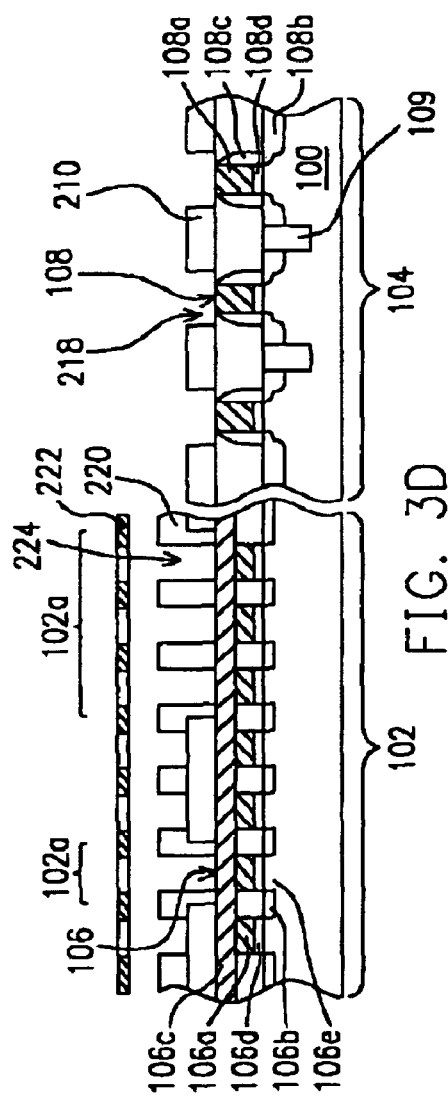
FIG. 3C
FIG. 3D

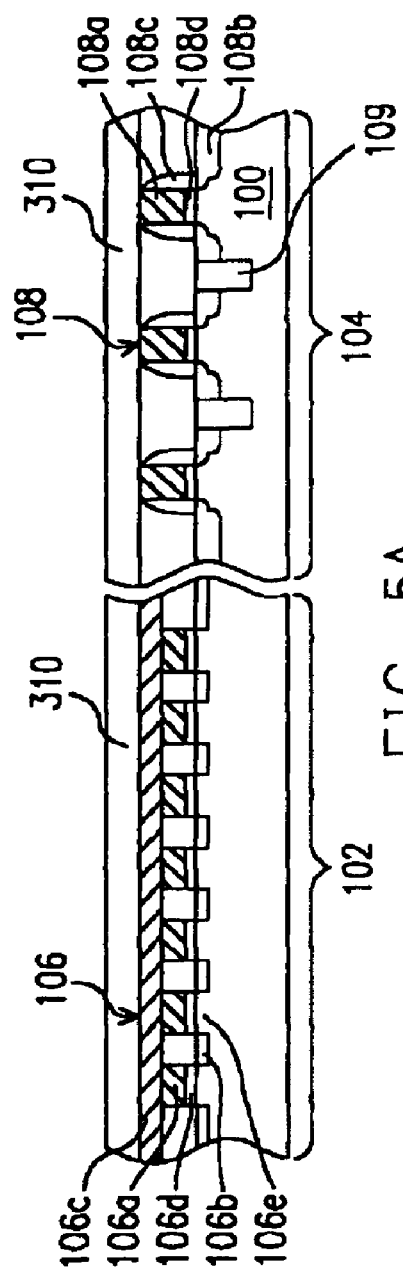
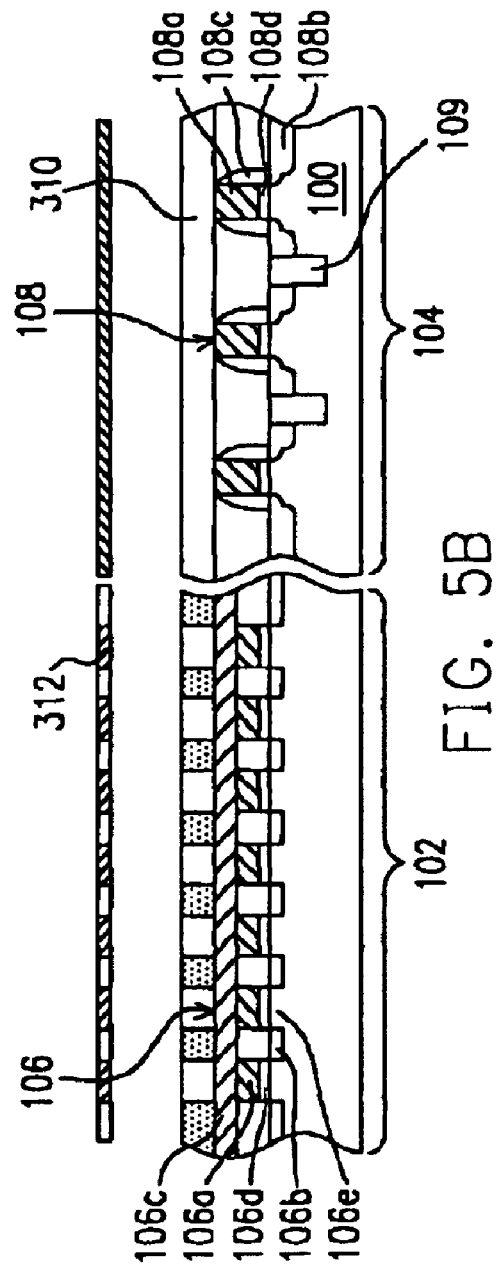
FIG. 5A
FIG. 5B

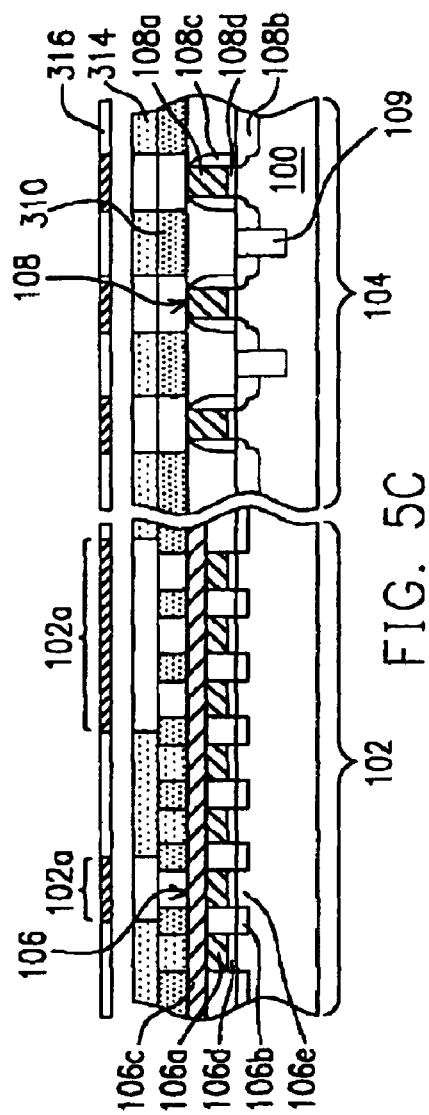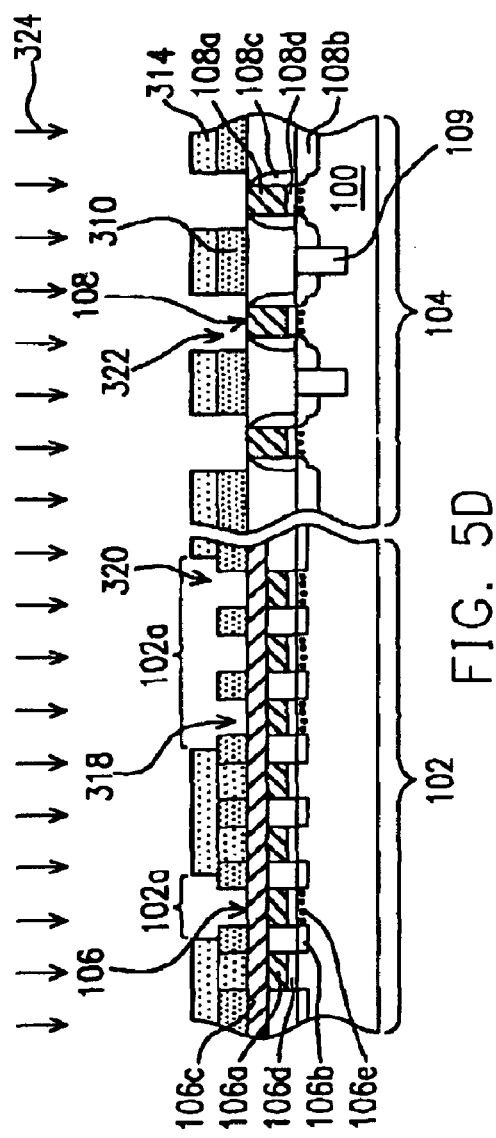

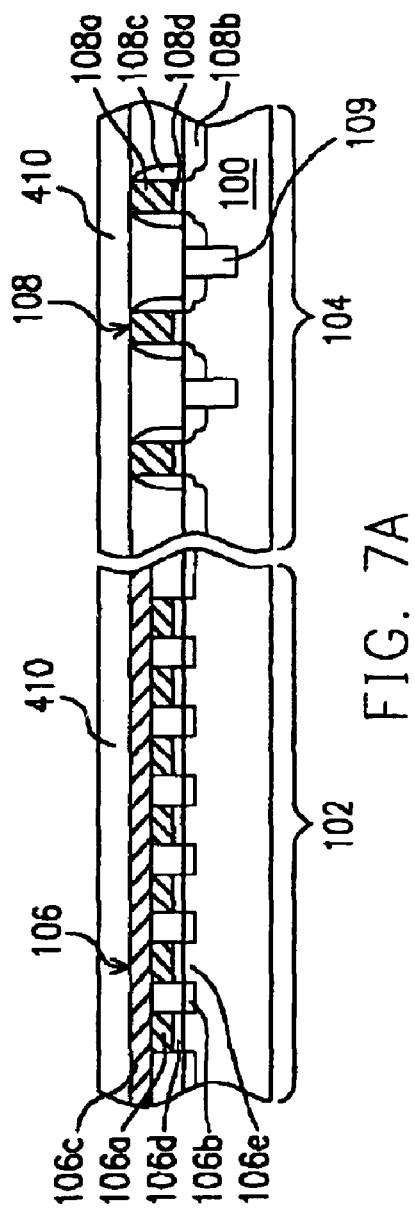
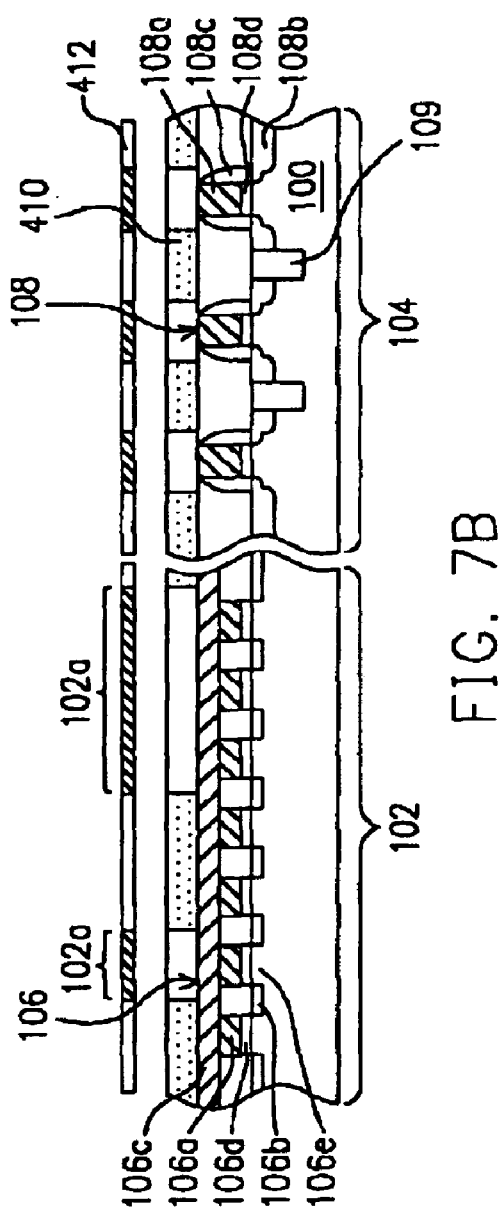
FIG. 7A
FIG. 7B

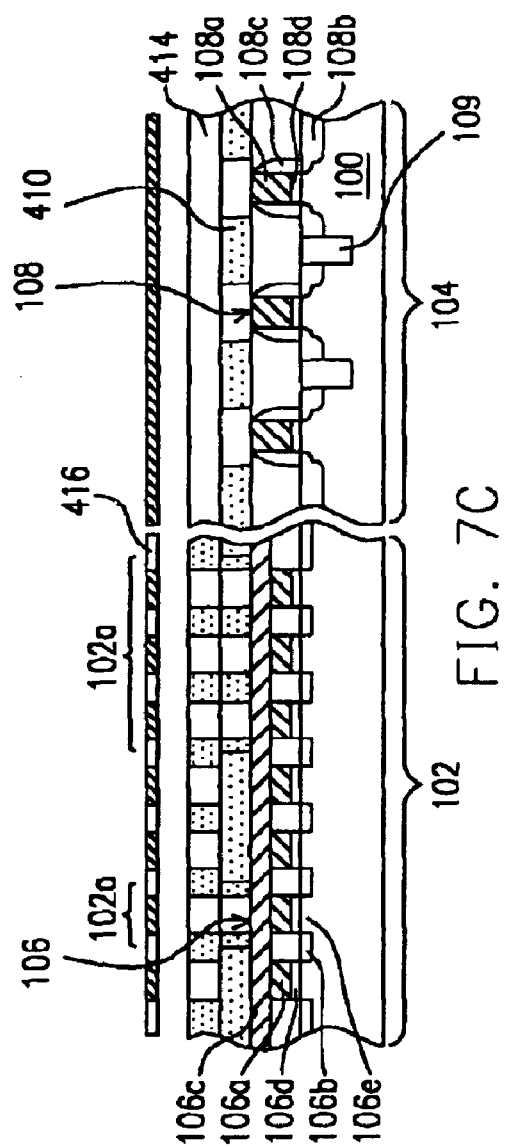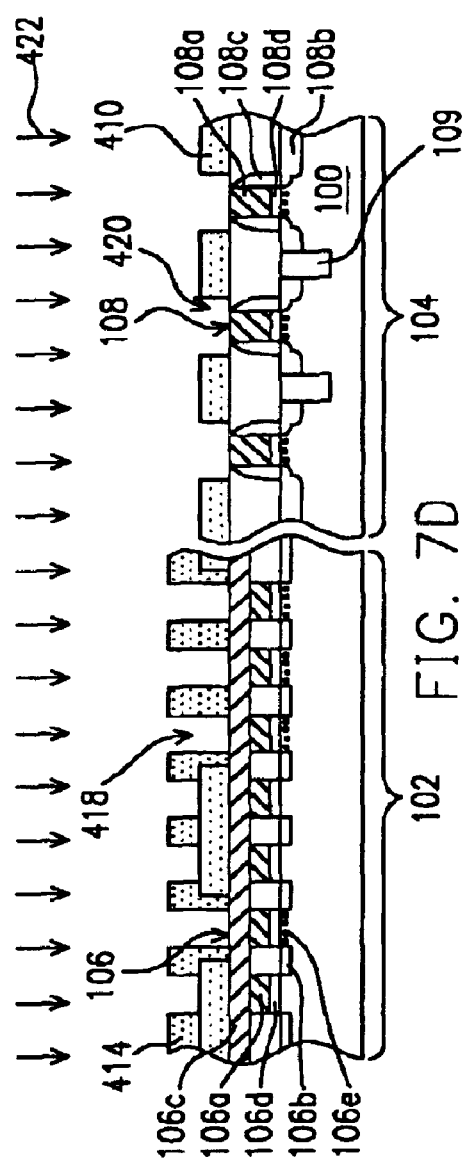

METHOD FOR FABRICATING READ ONLY MEMORY INCLUDING FORMING MASKING LAYERS WITH OPENINGS AND PRE-CODING THE CELL AND PERIPHERAL REGIONS

CROSS REFERENCE TO RELATED APPLICATIONS

This application claims the priority benefit of Taiwan application serial no. 91 105278, filed on Mar. 20, 2002.

BACKGROUND OF INVENTION

1. Field of the Invention

The present invention relates to a method for fabricating a memory device. More particularly, the present invention relates to a method for fabricating a read only memory device.

2. Description of Related Art

The read only memory device provides the non-volatile property, wherein the stored information is retained even electrical power is interrupted. As a result, the read only memory device is incorporated into many electronic products to maintain a normal operation for the products. The mask read only memory device is the most fundamental type of read only memory device. A typical mask ROM device uses a channel transistor as the memory device. The programming of a mask ROM device is accomplished by selectively implanting ions to an identified channel region. By altering the threshold voltage, the control of the "on" state and the "off" state of the memory device is thus achieved.

A typical mask read only memory device comprises a polysilicon word line crossing over a bit line. The region under the word line and between the bit lines is the channel region of the memory device. Whether or not ions are implanted to the channel region determines the storage of the binary digit of either "0" or "1", wherein the implanting of ions to the identified channel region is known as code implantation.

In general, when a code implantation process is performed on a mask read only memory, a patterned photoresist layer that exposes a pre-coding region is formed with a photomask. An ion implantation process is then performed to implant dopants to the pre-coding region in the substrate under the stacked gate structure. Usually, as required by the circuit design, an isolated pattern region and a dense pattern region are formed on a same photomask. An overexposure and an underexposure in the isolated pattern region and in the dense pattern region often occur during the transferring of a mask pattern due to the optical proximity effect. The accuracy of the critical dimension of the transferred pattern is thereby affected. Consequently, a misalignment would result as dopants are being implanted to the identified channel region of a mask read only memory device during the code implantation process. Information that is being stored in the memory cells of the memory device is thus erroneous to adversely affect the operational function of the memory device and the reliability of the products.

Conventionally, to correct the non-uniformity of pattern in the dense pattern region and the isolated pattern region of a coding mask of a mask read only memory device, the optical proximity correction technique is employed to design a mask with a special pattern. However, this type of mask with a special pattern, not only increases the manufacturing time, it also complicates the manufacturing process and increases the manufacturing cost. Further, after the fabrication of the photomask is completed, it is rather difficult to debug the defects in the pattern of this type of photomask.

SUMMARY OF INVENTION

Accordingly, the present invention provides a fabrication method for a read only memory device, wherein the openings in the dense pattern region and in the isolated patter region in the memory cell array of the mask read only memory device are formed having the same dimension, even without the application of the optical proximity correction technique.

Based on the foregoing reasons, the present invention provides a fabrication method for a read only memory device. The method provides a substrate that comprises a memory cell region and a periphery circuit region, wherein a memory cell array is formed in the memory cell region and a plurality of transistors is formed in the periphery circuit region. A precise layer that comprises a plurality of first openings is then formed on the identical. Further these first openings are located above the channel region of each of the first memory cells in the memory cell array. A mask layer that comprises a plurality of second openings and third openings is formed on the substrate. The aforementioned second openings are positioned above a plurality of the pre-coding memory cell regions in the memory cell region, while the third openings are positioned above the gates of the transistors in the periphery circuit region. An ion implantation process is then conducted to code the memory cells in the pre-coding memory cell region and to adjust the threshold voltage of the transistors.

The present invention employs a precise photomask to pattern a pattern-transferred layer (a precise layer), wherein openings are defined above the channel region of each memory cell and the critical dimension of these openings is identical. Another patterned photoresist layer (mask layer) is then formed on the substrate. The patterned photoresist layer exposes a pre-coding memory cell region in the memory cell region and a gates of the transistors in the periphery circuit region. Thereafter, using the pattern-transferred layer (precise layer) and the patterned photoresist layer (mask layer) as a coding mask for the mask read only memory device, the pre-coding memory cell is coded and the threshold voltage of the transistors is adjusted. According to the present invention, the critical dimension of each of the openings in the precise layer is about the same and each opening is precisely corresponded to the channel region of each memory cell. The problem of having critical dimension difference between the coding windows in the isolated pattern region and that in the dense pattern region due to the optical proximity effect is prevented. Further, when the code implantation is being performed on the pre-coding memory cell in the memory cell region, the threshold voltage of the transistors in the periphery circuit region is concurrently adjusted to further simplify the manufacturing process.

Further, the present invention also employs a photoresist layer as the pattern-transferred layer. When the pattern-transferred layer comprises a photoresist material, a deposition step and an etching step can be omitted to further simplify the manufacturing process and to further reduce the manufacturing cost. Moreover, according to the present invention, deviation in the critical dimension between the dense pattern region and the isolated pattern region is mitigated by using two photoresist layers.

Further, the precise layer in the periphery circuit region can be completely opened or selectively opened or completely not opened. The second opening and the third opening in the mask layer can form with one piece of photomask or two pieces of photomask.

The present invention provides a fabrication method for a read only memory device. This method provides a substrate that comprises a memory cell region and a periphery circuit region, wherein a memory cell array is formed in the memory cell region and a plurality of transistors is formed in the periphery circuit region. A mask layer that comprises a plurality of first openings and second openings is formed on the substrate. The first openings are located above a plurality of pre-coding memory cell regions in the memory cell region and the second openings are located above the gates of the transistors in the periphery circuit region. A precise layer is formed on the memory cell region. The precise layer comprises a plurality of third openings, wherein the critical dimension of each of the third openings is identical and the third openings are positioned above the channel region of the pre-coding memory cell in the pre-coding memory cell region. Thereafter, an ion implantation process is conducted to code the pre-coding memory cells in the pre-coding memory cell region and to adjust the threshold voltage of the transistors, using the mask layer and the precise layer as a coding mask.

Accordingly, the present invention employs a photomask to pattern the pattern-transferred layer, wherein the pre-coding memory cell region in the memory cell region and the gates of the transistors in the periphery circuit region are exposed. Further using the precise photomask, a plurality of openings having the same critical dimension is defined in the memory cell region. Further, these openings are located above the channel regions of the pre-coding memory cell in the pre-coding memory cell regions, exposing the word line of the memory cell. The critical dimension of each opening in the precise layer is identical and each opening in the precise layer precisely corresponds to the channel region of each memory cell. Even without the application of the optical proximity correction technique to manufacture the coding mask, any deviation in the critical dimension of the coding window between the dense pattern region and the isolated pattern region due to the optical proximity effect is prevented. Further, according to the present invention, when the coding implantation is being performed on the pre-coding memory cells in the memory cell region, the threshold voltage of the transistors in the periphery circuit region is being adjusted concurrently to further simplify the manufacturing process.

Further, the present invention employs a photoresist layer as a patterned transferred layer. When the pattern-transferred layer comprises a photoresist material, a deposition step and an etching step can be omitted to further simplify the manufacturing procedure and to further reduce the manufacturing cost. Moreover, the present invention simply employs two layers of photoresist to improve any deviation in the critical dimension between the dense pattern region and the isolated pattern region.

Further, the first opening and the second opening of the mask layer can form with one piece of photomask or two pieces of photomask. The precise layer in the periphery circuit region can be completely opened or selectively opened or completely not opened.

The present invention provides a fabrication method for a read only memory device. The method provides a substrate that comprises a memory cell region and a periphery circuit region, wherein a memory cell array is already formed in the memory cell region and a plurality of transistors is formed in the periphery circuit region. A negative photoresist layer is then formed on the memory cell region, followed by performing a first exposure process to transfer the pattern of the first photomask to the first negative photoresist layer, wherein the pattern of the first photomask precisely correspondes to the channel region of each memory cell in the memory cell region. The non-crosslinked portion of the first photoresist layer is positioned above the channel region of each memory cell in the memory cell region. A second negative photoresist layer is then formed on the substrate. A second exposure process is performed to transfer the pattern of the second photomask to the second photoresist layer and to the first negative photoresist layer, wherein the pattern of the second photomask corresponds to a plurality of the pre-coding memory cell regions in the memory cell region and the gates of the transistors in the periphery circuit region. As a result, the non-crosslinked portions of the first negative photoresist layer and the second photoresist layer are positioned above the plurality of the pre-coding memory cell regions in the memory cell region and above the gates of the transistors in the periphery circuit region. A development process is conducted to pattern the first negative photoresist layer and the second photoresist layer. An ion implantation process is conducted to code the pre-coding memory cells in the pre-coding memory cell region and to adjust the threshold voltage of the transistors using the patterned first negative photoresist layer and the pattern second negative photoresist layer as a mask.

According to the present invention, after forming the first negative photoresist layer, the pattern of the precise photomask is transferred to the first negative photoresist layer, wherein the non-crosslinked portion of the first negative photoresist layer is located above the channel region of each memory cell. Thereafter, a second negative photoresist layer is formed. The pattern of the second photomask is then transferred to the first negative photoresist layer and the second negative photoresist layer. The opaque portion of the second photomask is positioned above the pre-coding memory cell region in the memory cell region and above the gates of the transistors in the periphery circuit region. Therefore, the non-crosslinked portions of the first negative photoresist layer and the second negative photoresist layer are positioned above the pre-coding memory cells in the pre-coding memory cell region. Moreover, the non-crosslinked portion of the second negative photoresist layer is also positioned above the gates of the transistors in the peripheral circuit region. After this, the non-crosslinked portions of the first negative photresist layer and the second photoresist layer are removed to form a plurality of openings in the memory cell region, wherein the critical dimension of these openings is identical. Further, these openings are located above the channel region of each pre-coding memory cell in the pre-coding memory cell region. Since the critical dimension of each opening above the channel region of the pre-coding memory cell in the pre-coding memory cell region is identical, any deviation in the critical dimension of the coding window between the dense pattern region and the isolated pattern region due to the optical proximity effect is prevented, even without the application of the optical proximity correction technique to manufacture the coding mask. Moreover, as the code implantation is being performed to the pre-coding memory cell in the memory cell region in the present invention, the threshold voltage of the transistors in the periphery circuit region is concurrently being adjusted to further simplify the manufacturing process.

Accordingly, the present invention sequentially performs two exposure processes on the two negative photoresist layers with two layers of the photomask and a single development process to pattern the two negative photoresist layers. The number of manufacturing steps in the present invention is greatly reduced to further reduce the manufacturing time and cost. Moreover, the two negative photoresist layers can be formed into a same photoresist layer. In summary, the present invention simply employs two photoresist layers to improve the deviation in the critical dimension of the coding window between the dense pattern region and the isolated pattern region due to the optical proximity effect.

The present invention further provides a fabrication method for a read only memory device. The method provides a substrate that comprises a memory cell region and a periphery circuit region, wherein a memory cell array is already formed in the memory cell region and a plurality of transistors is already formed in the periphery circuit region. A first negative photoresist layer is formed on the substrate, followed by performing a first exposure process to transfer the pattern in the first photomask to the first negative photoresist layer, wherein the pattern in the first photomask corresponds to a plurality of pre-coding memory cells and the gates of the transistors in the periphery circuit region. The non-crosslinked portion of the first negative photoreisist layer is positioned above a plurality of the pre-coding memory cell regions in the memory cell region and the gate of the transistors in the periphery circuit region. The pre-coding memory cell region further comprises the plurality of the pre-coding memory cells. Thereafter, a second negative photoresist layer is formed on the memory cell region. A second exposure process is performed to transfer the pattern of the second photomask to the first negative photoresist layer and the second negative photoresist layer, wherein the pattern in the second photomask precisely corresponds to the channel region of each memory cell in the memory cell region. The non-crosslinked portions of the second photoresist layer and the first photoresist layer are located above the channel region of each memory cell in the pre-coding memory cell region. A development process is performed to pattern the first negative photoresist layer and the second negative photoresist layer. Using the patterned first negative photoresist layer and the second negative photoresist layer as a mask, an ion implantation process is conducted to code the pre-coding memory cells in the pre-coding memory cell region and to adjust the threshold voltage of the transistors.

According to the present invention, subsequent to the formation of the first negative photoresist layer, the pattern of the first photomask is transferred to the first negative photoresist layer. The opaque portion of the first photomask is located above the pre-coding memory cell regions in the memory cell region and the gates of the transistors in the periphery region. Therefore, the non-crosslinked portion of the first negative photoresist layer in the memory cell region is located above the pre-coding memory cell regions and the gates of the transistors. Thereafter, a second negative photoresist layer is formed, followed by transferring the pattern of the second photomask (precise mask) to the first negative photoresist layer and to the second negative photoresist layer. The non-crosslinked portion of the first negative photoresist layer and the second negative photoresist layer are positioned above the channel region of each memory cell. After this, the non-crosslinked portions of the first negative photoresist layer and the second negative photoresist layer are removed to form a plurality of openings having identical critical dimension. These openings are positioned above the channel region of each memory cell in the pre-coding memory cell region, exposing the word line of the memory cell. Since the critical dimension of the openings above the channel region of each pre-coding memory cell is identical deviation in the critical dimension of the coding window between the dense pattern region and the isolated pattern region due to the optical proximity effect is prevented, even without the application of the optical proximity correction technique. Moreover, as code implantation is performed on the pre-coding memory cells in the memory cell region, the threshold voltage of the transistosr in the periphery circuit region is concurrently adjusted to further simplify the manufacturing process.

Accordingly, the present invention sequentially performs two exposure processes on the two negative photoresist layers with two layers of the photomask and a single development process to pattern the two negative photoresist layers. The number of manufacturing steps in the present invention is greatly reduced to further reduce the manufacturing time and cost. Moreover, the two negative photoresist layers can be formed into a same photoresist layer. In summary, the present invention simply employs two photoresist layers to improve the deviation in the critical dimension of the coding window between the dense pattern region and the isolated pattern region due to the optical proximity effect.

Although two photomasks are employed in the manufacturing of a read only memory, one of the photomasks is only required to expose the pre-coding memory cell region in the memory cell region and to concurrently expose the transistors in the periphery circuit region during the coding process. Therefore, this photomask does not have to be as precise as the conventional coding mask. The manufacturing cost for this photomask is thus lower. The other photomask in this embodiment is a precise mask, wherein the specification is uniform. Although the manufacturing cost for this photomask is higher, this photomask can be used repeatedly because the precise mask is only applicable for forming the openings having identical critical dimension in the channel region of the memory cell. Further, the conventional coding mask requires the optical proximity correction technique to mitigate the inaccuracy in pattern transference due to the optical proximity effect, the manufacturing cost for the conventional coding mask is thus very high. In the present invention, the pattern dimension in the dense pattern region and the pattern dimension in the isolated pattern region are identical, even without the application of a special patterned photomask formed with the optical proximity correction technique, the manufacturing cost is thus lower. Further, the advantages provided by the present invention can be accomplished whether the mask layer is formed before the precise layer or the precise layer is formed before the mask layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A to 1E are schematic cross-sectional views illustrating the process flow for fabricating a mask read only memory device according a first embodiment of the present invention;

FIGS. 3A to 3E are schematic cross-sectional views illustrating the process flow for fabricating a mask read only memory device according to a second embodiment of the present invention;

FIGS. 5A to 5D are schematic cross-sectional views illustrating the process flow for fabricating a mask read only memory device according to a third embodiment of the present invention;

FIGS. 7A to 7D are schematic cross-sectional views illustrating the process flow for fabricating a mask read only memory device according to a fourth embodiment of the present invention.

DETAILED DESCRIPTION

The First Embodiment

FIGS. 1A to 1E are schematic cross-sectional views illustrating the process flow for fabricating a mask read only memory device according a first embodiment of the present invention. FIGS. 2A to 2E are schematic top views illustrating the process flow for fabricating a mask read only memory device according to the first embodiment of the present invention, wherein the memory cell regions in FIGS. 1A to 1E are the cross-sectional views of FIGS. 2A to 2E along the line I-I".

Figure 1C:
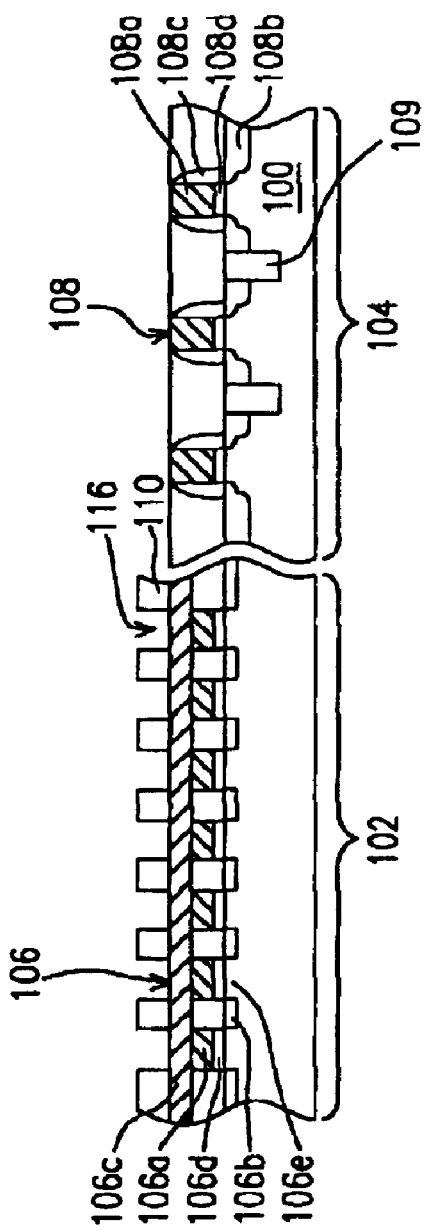
Figure 2A:
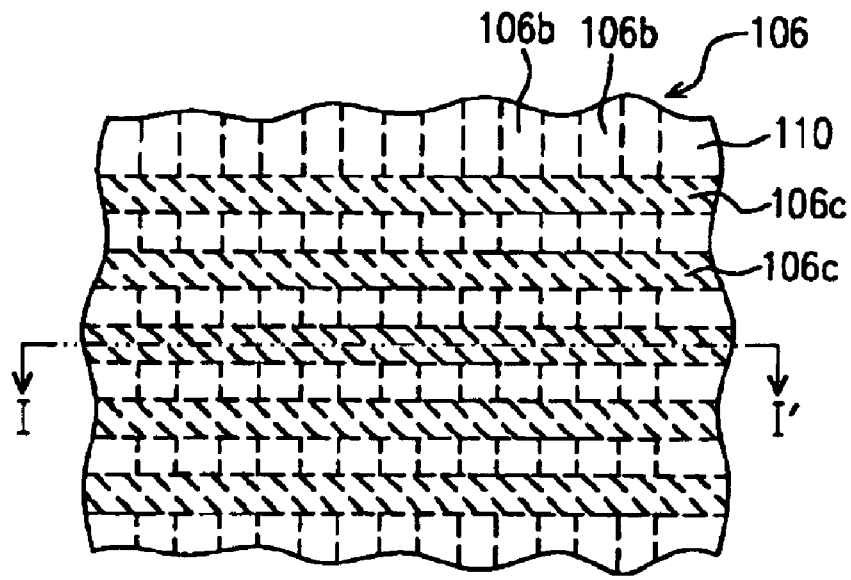
FIGS. 2A to 2E are schematic top views illustrating the process flow for fabricating a mask read only memory device according to the first embodiment of the present invention.

Referring to FIGS. 1A and 2A, a substrate 100 is provided, wherein the substrate 100 is divided into a memory cell region 102 and a periphery circuit region 104, wherein the memory cell region 102 comprises a memory cell array 106, while the periphery circuit region 104 comprises a plurality of transistors 108.

The memory cell array 106 in the memory cell region 102 is formed with a plurality of gates 106a, a plurality of bit lines 106b and a plurality of word lines 106c. The gates 106a are disposed on the substrate 100. A gate dielectric layer 106d is further disposed between the gate 106a and the substrate 100. The bit line 106b is positioned between the gates 106a in the substrate 100, while the word line 106c crosses over the bit line 106b and electrically connects with the gate 106a. Moreover, the region underneath the gate 106a and between two bit lines 196b serves as the channel region 106e of a memory device.

The transistors 108 in the periphery circuits region are isolated from each other with isolation structures 109. Each transistor 108 is formed with a gate 108a, source/drain regions 108b and a spacer 108c. The gate 108a is disposed on the substrate 100, and a gate dielectric layer 108d is further disposed between the gate 108a and the substrate 100. The source/drain regions 108b are located beside the sides of the gate 108a in the substrate 100. The spacer 108c is disposed on the sidewall of the gate 108a.

Thereafter, a pattern-transferred layer 110 is formed on the substrate 100, wherein the pattern-transferred layer 110 is formed with a material that includes silicon oxide, silicon nitride or silicon oxynitride. The pattern-transferred layer 110 is formed by, for example, chemical vapor deposition.

Figure 2B:
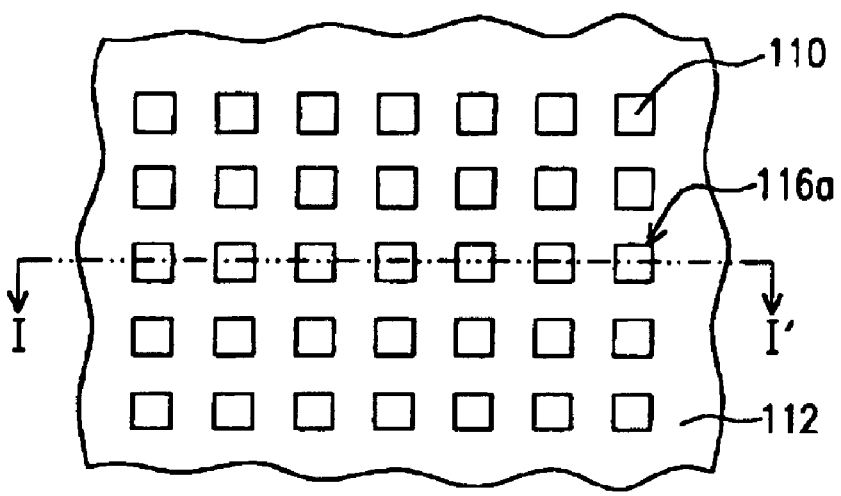

Referring to FIGS. 1B and 2B, a photoresist layer 112 is formed on the pattern-transferred layer 110. A photolithography process is then performed to transfer the pattern of the photomask 114 to the photoresist layer 112, patterning the photoresist layer 112. The photomask 114 is, for example, a precise mask, wherein this mask 114 comprises a plurality of patterns with identical critical dimension. Further these patterns are arranged in a matrix. Therefore, the pattern density in each region of the photomask 114 is identical. After patterning the photoresist layer 112, the photoresist layer 112 in the memory cell region 102 comprises a plurality of openings 116a. These openings 116a are disposed above the channel region 106e of each memory cell in the memory cell region 102, exposing a portion of the pattern-transferred layer 110. Concurrently, the patterned photoresist layer 112 also exposes the pattern-transferred layer 110 in the periphery circuit region 104.

Figure 2C:
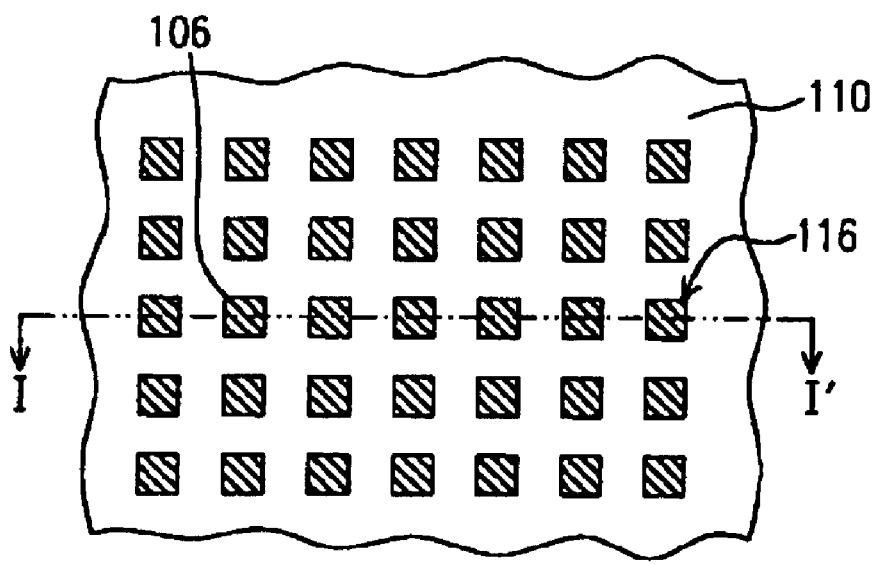

Continue to FIGS. 1C and 2C, using the patterned photoresist layer 112 (as shown in FIGS. 1B and 2B) as an etching mask, an etching is performed to remove the pattern-transferred layer 110 that is exposed by the openings 116a to form a plurality of openings 116. The pattern-transferred layer 110 at the periphery circuit region 104 is also removed. The openings 116 are positioned above the channel region 106e of each memory cell in the memory cell array 106, exposing a portion of the word line 106c of the memory cell. The patterned pattern-transferred layer 110 serves as a precise layer, wherein the critical dimension of each opening 116 in the precise layer are about the same.

Figure 1D:
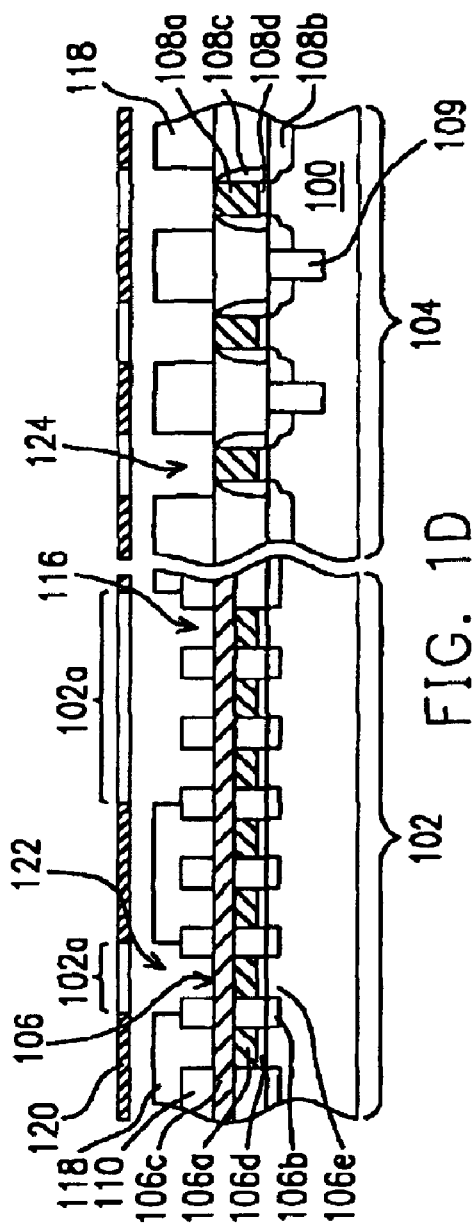
Figure 2D:
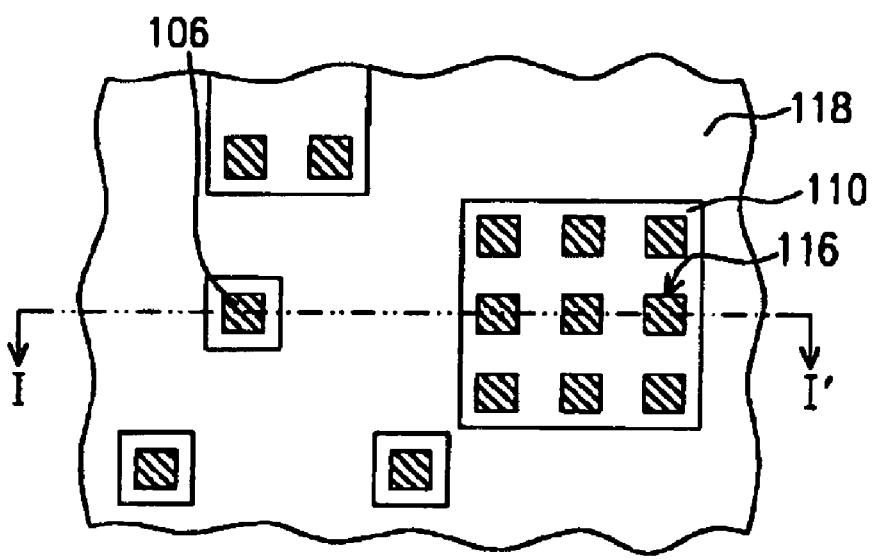

Continuing to FIGS. 1D and 2D, another photoresist layer 118 is formed on the substrate 100 of both the memory cell region 102 and the periphery circuit region 104. A photolithography process is then performed to transfer the pattern of the photomask 120 to the photoresist layer 118, patterning the photoresist layer 118. The patterned photoresist layer 118 in the memory cell region 102 comprises a plurality of openings 122, wherein these openings 122 expose the pre-coding memory cell region 102a in the memory cell region 102. The pre-coding memory cell region 102a comprises at least one of the pre-coding memory cell to be coded. In other words, the patterned photoresist layer 118 in the memory cell region 102 covers a portion of the openings 116 in the patterned-transferred layer 110 (precise layer) and exposes the openings 116 over the pre-coding memory cell region 102a. Further, the patterned photoresist layer 118 in the periphery circuit region 104 comprises a plurality of openings 124, wherein these openings 124 expose the gates 108a of the transistors 108. In this embodiment, the pattern-transferred layer 110 (precise layer) and the patterned photoresist layer 118 serve as the coding mask for the mask read only memory device.

Figure 1E:
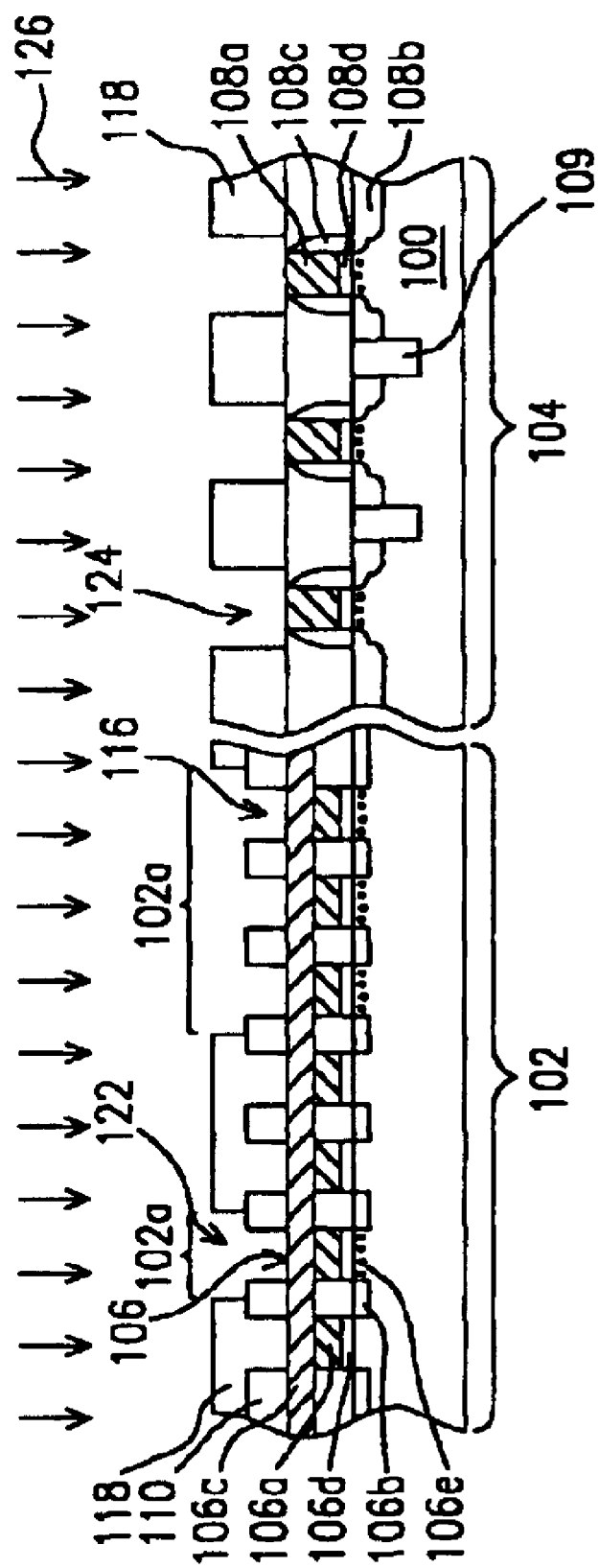
Figure 2E:
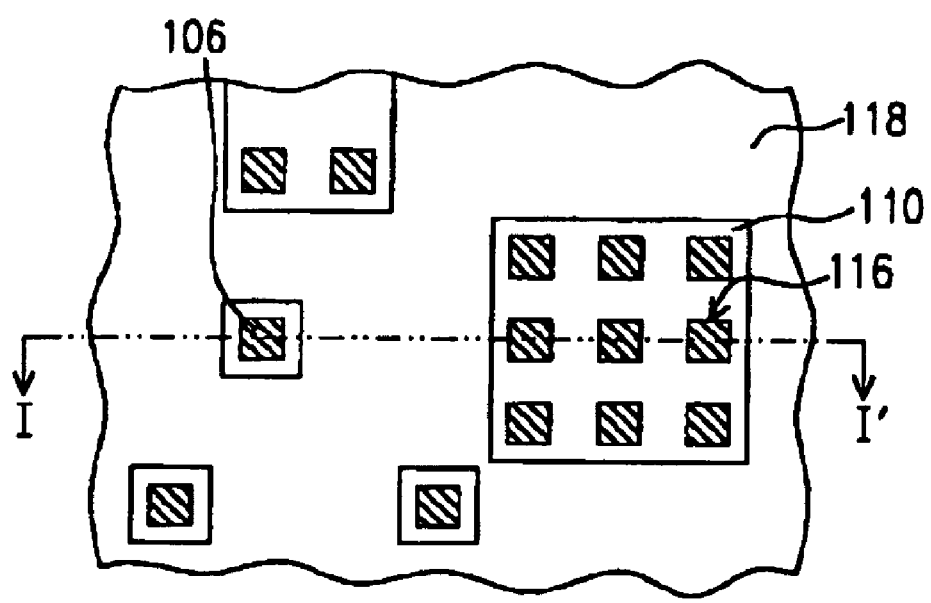

Referring to FIGS. 1E and 2E, an ion implantation process 126 is performed to code the memory cell by implanting dopants to the channel region 106e underneath the gates 106 of each pre-coding memory cell in the memory cell region 102. Moreover, the threshold voltage adjustment is also performed on the transistors 108 in the periphery circuit region 104.

As required by the circuit design, an isolated pattern region and a dense pattern region are formed in the memory cell region of the mask read only memory device. However, using a single piece of photomask to define the coding windows in the isolated pattern region and in the dense pattern region, deviation in the critical dimension between the isolated pattern region and the dense pattern region due to optical proximity effect is generated. Therefore, according to the above embodiment of the present invention, a precise photomask is used to pattern the pattern-transferred layer (precise layer) to define the openings 116 above the channel region 106e of each memory cell, wherein the critical dimension of the openings 116 is about identical. Another patterned photoresist layer 118 is further formed on the substrate 100, wherein the patterned photoresist layer 118 exposes the pre-coding memory cell region 102a in the memory cell region 102 and the transistors 108 in the periphery circuit region 104. The pattern-transferred layer 110 (precise layer) and the patterned photoresist layer 118 are then served as the coding mask for the mask read only memory device. Since the critical dimension of every opening 116 in the precise layer is about identical, deviation in the critical dimension of the coding window between the dense pattern region and the isolated pattern region due to the optical proximity effect is prevented, even without the application of the optical proximity correction technique to manufacture the coding mask.

Further, two photomasks are used in the above embodiment. One mask 114 is a precise mask, wherein the specification is uniform. Although the manufacturing cost for such a mask 114 is higher, the precise mask can be used repeatedly because the precise mask is only used to form openings with precisely identical critical dimension over the channel region of the memory cell. The other photomask 120 that is being used in this embodiment is required only to expose the pre-coding memory cell region in the memory cell region during the coding process. Therefore, the precision of this photomask 120 is not as imperative as that of the conventional coding mask. Consequently, the manufacturing cost for this photomask 120 is lower. Since the conventional coding mask requires the application of an optical proximity correction technique to prevent any pattern transference problem created from the optical proximity effect, the manufacturing cost for the conventional coding mask is very high. In the present invention, the dimension of the pattern in the dense pattern region and in the isolated pattern region is about the same, even without the application of a special patterned photomask formed by the application of the optical proximity correction technique, the manufacturing cost is thus reduced. Further, performing the code implantation to the pre-coding memory cells in the memory cell region, the threshold voltage of the transistors in the periphery circuit region is concurrently being adjusted. The manufacturing process is thus greatly simplified.

Further, in the above first embodiment, a photoresist layer can be used as the pattern-transferred layer. If the pattern-transferred layer comprises a photoresist material, a deposition step and an etching step can be omitted to further simplify the manufacturing process and to further reduce the manufacturing cost. Moreover, according to the present invention, simply using two photoresist layers, the deviation in the critical dimension between the dense pattern region and the isolated pattern region due to the optical proximity effect is improved.

Additionally, the precise layer in the periphery circuit region can be completely opened or selectively opened or completely not opened. The opening that exposes the pre-coding memory cell region in the memory cell region and the opening that exposes the transistor gates in the periphery circuit region can be formed with one piece of photomask or two pieces of photomasks.

The Second Embodiment

FIGS. 3A to 3E are schematic cross-sectional views illustrating the process flow for fabricating a mask read only memory device according to a second embodiment of the present invention. FIGS. 4A to 4E are schematic top views illustrating the process flow for fabricating a mask read only memory device according to the second embodiment of the present invention, wherein the memory cell region in FIGS. 3A to 3E are the cross-sectional views of FIGS. 4A to 4E along the line II-II". Wherever possible, the same reference numbers are used in the second embodiment and the first embodiment to refer to the same or like parts.

Figure 3E:
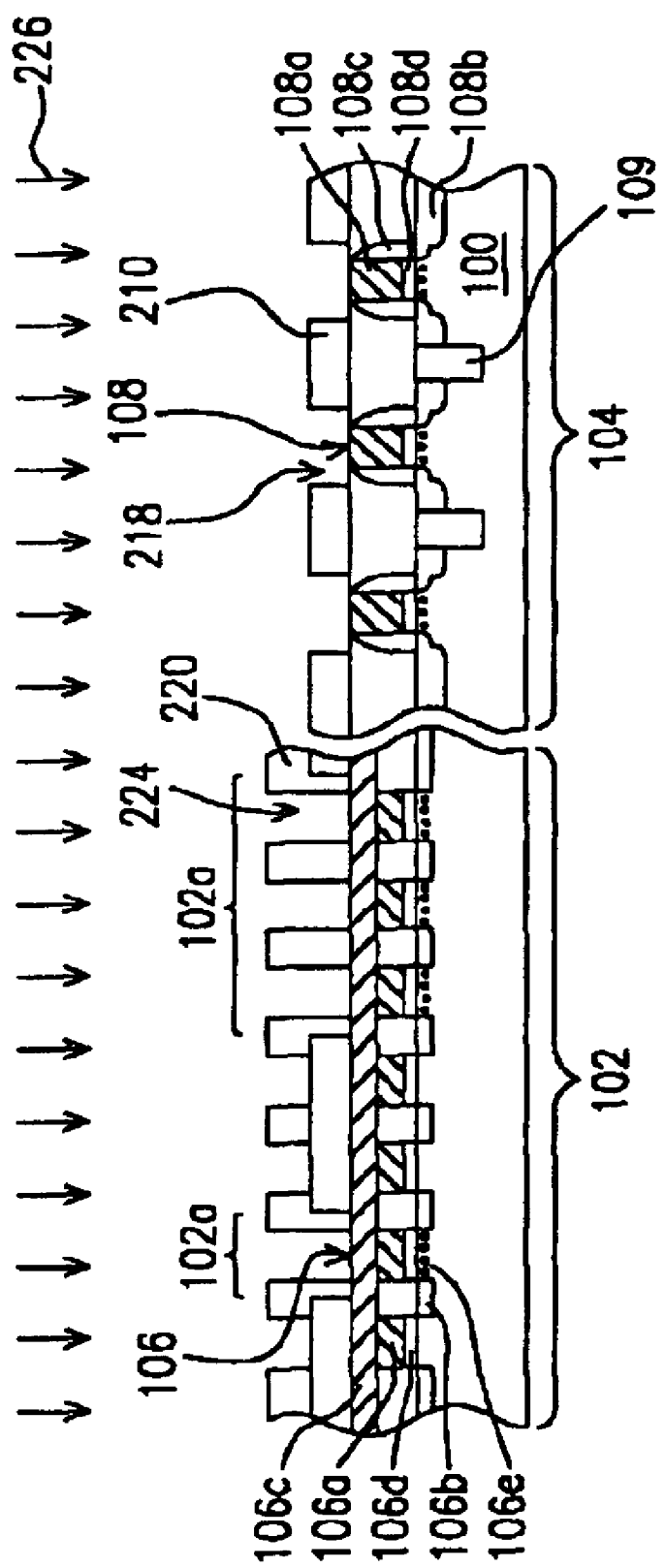
Figure 4A:
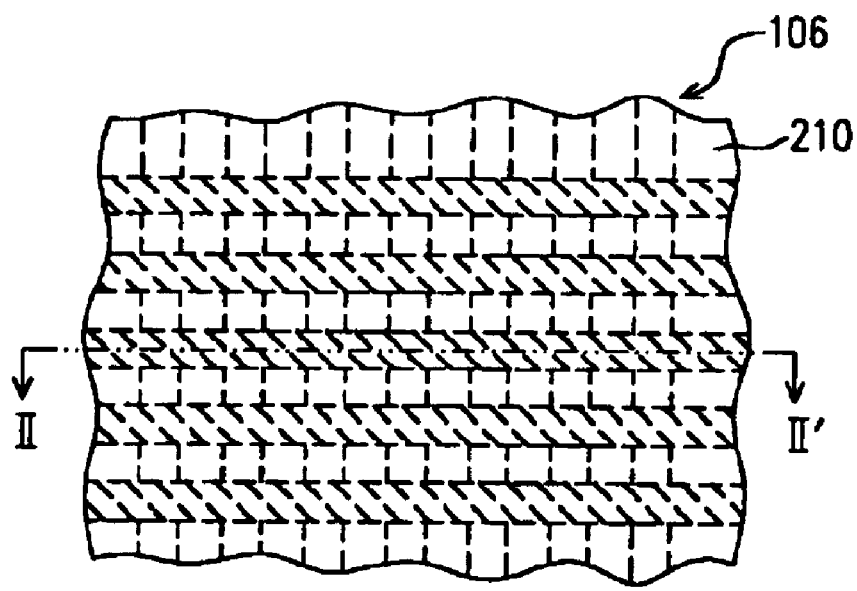
FIGS. 4A to 4E are schematic top views illustrating the process flow for fabricating a mask read only memory device according to the second embodiment of the present invention.

Referring to FIGS. 3A and 4A, a substrate 100 is provided, wherein the substrate 100 is divided into a memory cell region 102 and a periphery circuit region 104. An array of memory cells 106 is already formed in the memory cell region 102, while a plurality of transistors 108 is formed in the periphery circuit region 104. The structures of the array of memory cells 106 and the transistors are same as those in the first embodiment and thus will not further reiterate.

Thereafter, a pattern-transferred layer 210 is formed on the substrate 100 of the memory cell region 102 and the periphery circuit region 104. A material for the pattern-transferred layer 210 is, for example, silicon oxide, silicon nitride or silicon oxynitride. The pattern-transferred layer 210 is formed by, for example, chemical vapor deposition.

Figure 4B:
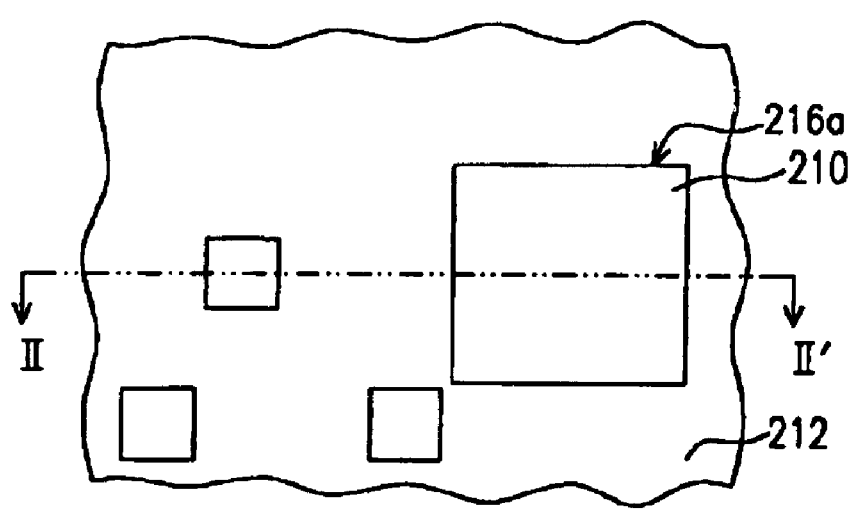

Referring to FIGS. 3B and 4B, a photoresist layer 212 is formed on the pattern-transferred layer 210. A photolithography process is then conducted to transfer the pattern of the photomask 214 to the photoreist layer 212, patterning the photoresist layer 212. The patterned photoresist layer 212 in the memory cell region 102 comprises a plurality of openings 216a, wherein these openings 216a are located above the pre-coding memory cell region 102a and these openings 216a expose a portion of the surface of the pattern-transferred layer 210. The patterned photoresist layer 212 also comprises a plurality of openings 218a in the peripheral circuit region 104, wherein these openings 218a are positioned above the gates 108a of the transistors, exposing the surface of the pattern-transferred layer 210.

Figure 4C:
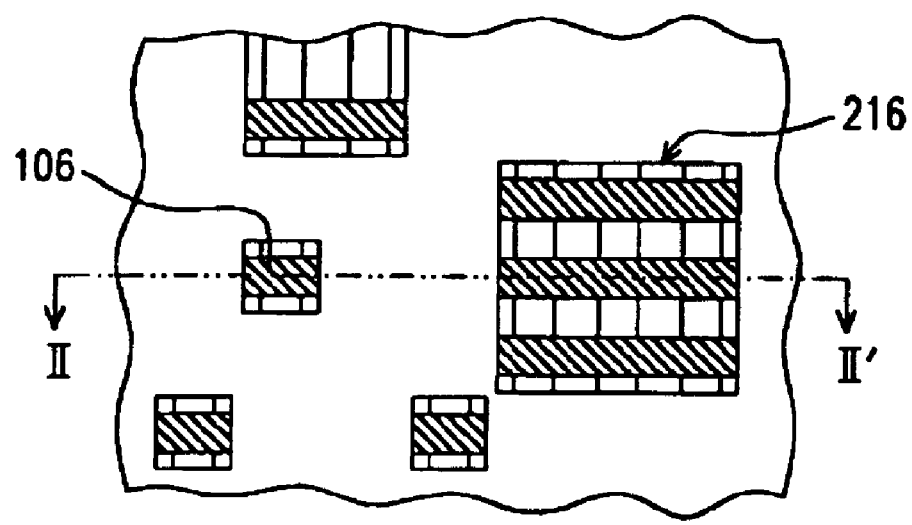

Continuing to FIGS. 3C and 4C, an etching is conducted to remove the pattern-transferred layer 210 exposed by the openings 216a and the openings 218a, using the patterned photoresist layer 212 (as shown in FIG. 3B and FIG. 4B) as an etching mask. A plurality of openings 216 is thus formed to expose the pre-coding memory cell region 202a and a plurality of openings 218 is thus formed to expose the gates 108a of the transistors 108. The patterned pattern-transferred layer 210 is then served as a hard mask. Subsequently, the photoresist layer 212 is removed.

Figure 4D:
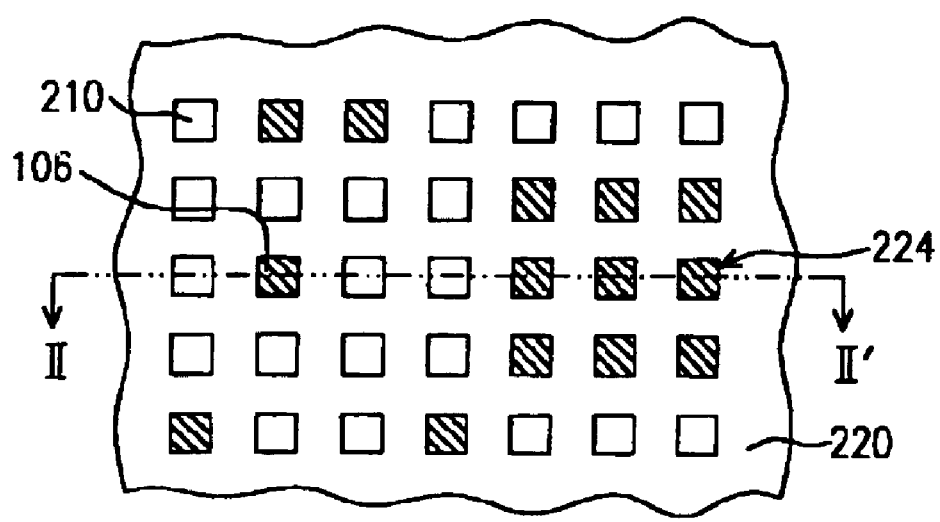

Referring to FIGS. 3D and 4D, a photoresist layer 220 is formed on the substrate 100. A photolithography process is then performed to transfer the pattern of the photomask 222 to the photoresist layer 220, patterning the photoresist layer 220. The photomask 222 is, for example, a precise mask. The precise mask 222 comprises a plurality of patterns having identical critical dimension. Further, these patterns are arranged in a matrix. The pattern density in each region on the photomask 220 is about the same. The patterned photoresist layer 220 serves as a precise layer. This precise layer comprises a plurality of openings 224, positioned above the channel region 106e of each memory cell in the pre-coding memory cell region. These openings 224 expose the word line 106c of the memory cell. Further, the critical dimension of the opening 224 is identical. The patterned pattern-transferred layer 210 and the patterned photoresist layer 220 (precise layer) serve as the coding mask for the mask read only memory device.

Figure 4E:
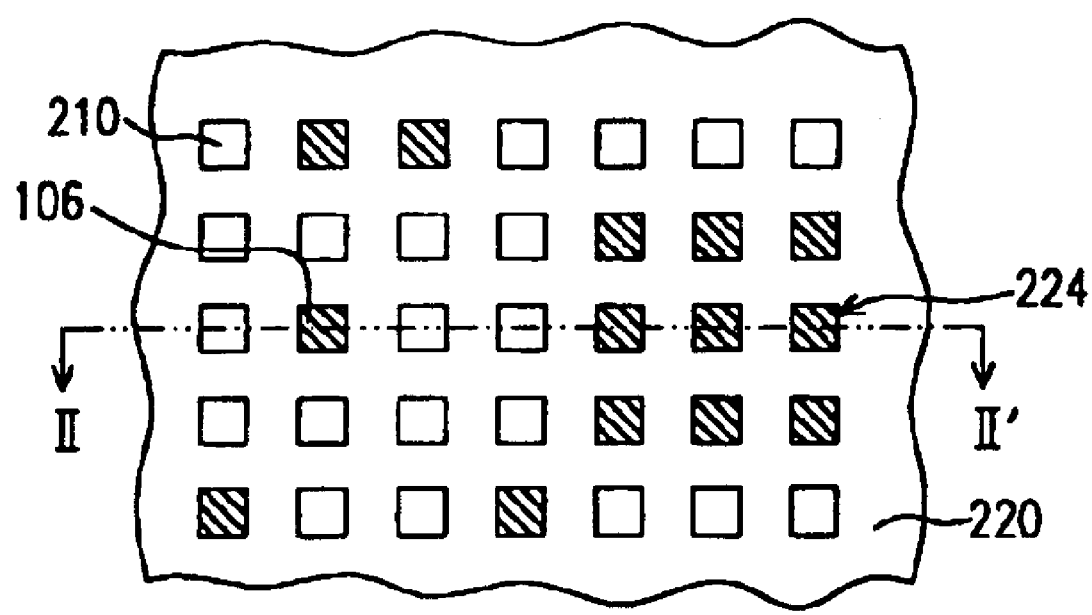

Referring to FIGS. 3E and 4E, an ion implantation process 226 is performed to code the memory cells by implanting dopants to the channel region 106e underneath the gate 106a of the pre-coding memory cells in the memory cell region 102. Concurrently, the threshold voltage of the transistor 108 in the periphery circuit region 104 is adjusted to complete the code implantation process for the mask read only memory device.

According to the above second embodiment of the present invention, a photomask 214 is used to pattern the pattern-transferred layer 210 to expose the pre-coding memory cell region 102a in the memory cell region 102. The gates 108a of the transistors 108 in the periphery circuit region 104 are also exposed. Further using the precise mask 222 to define a plurality of openings 224 in the memory cell region, wherein the openings 224 have the same critical dimension. Also, these openings 224 are formed above the channel region 106e of each pre-coding memory cell in the pre-coding memory cell region 102a and expose the word line 106c of the memory cell. Since the critical dimension of each opening 224 in the precise layer is about identical and the openings 224 precisely correspond to the channel region 106e of each memory cell, the application of the optical proximity correction technique to fabricate the coding photomask is obviated. Accordingly, deviation in the critical dimension of the coding window between the dense pattern region and the isolated pattern region due to the optical proximity effect is prevented, even without the application of the optical proximity correction technique to manufacture the coding mask.

Although two photomasks are employed in the above embodiment, one of the masks 214 is used only to expose the pre-coding memory cell region in the memory cell region during the coding process and to concurrently expose the transistors in the periphery circuit region, the precision of this mask 214 is not as imperative as that of the conventional coding mask. The manufacturing cost for this mask 214 is thus lower. The other mask 222 in this embodiment is a precise mask, wherein the specification of this mask 222 is uniform. Although the manufacturing cost for this mask 222 in the second embodiment is higher, the mask 222 can be used repeatedly because it is only used for forming openings 224 with identical critical dimension above the channel region of the memory cell. Since the conventional coding mask requires the optical proximity correction technique to prevent any inaccuracy in the transferred pattern due to the optical proximity effect, the manufacturing cost for the conventional coding mask is very high. The pattern dimension in the dense pattern region and the isolated pattern region is uniform, even without the application of a special patterned photomask formed by using the optical proximity correction technique, the manufacturing cost for the present invetnion is lower. Further, performing the coding implantation to the pre-coding memory cells in the memory cell region, the threshold voltage of the transistors in the periphery circuit region is concurrently being adjusted. The manufacturing process is thus greatly simplified.

Further, in the above second embodiment, a photoresist layer can be used for the pattern-transferred layer. If the pattern-transferred layer comprises a photoresist material, a deposition step and an etching step can be omitted to further simplify the manufacturing process and to further reduce the manufacturing cost. Moreover, according to the present invention, simply using two layers of the photoresist, the deviation in the critical dimension between the dense pattern region and the isolated pattern region due to the optical proximity effect can be improved.

Additionally, the precise layer in the periphery circuit region can be completely opened or selectively opened or completely not opened. The opening that exposes the pre-coding memory cell region in the memory cell region and the opening that exposes the transistor gate in the periphery circuit region can be formed with one piece of photomask or two pieces of photomask.

Third Embodiment

FIGS. 5A to 5D are schematic cross-sectional views illustrating the process flow for fabricating a mask read only memory device according to a third embodiment of the present invention. FIGS. 6A to 6D are schematic top views illustrating the process flow for fabricating a mask read only memory device according to the second embodiment of the present invention, wherein the memory cell region in FIGS. 5A to 5D are the cross-sectional views of FIGS. 6A to 6D along the line III-III". Wherever possible, the same reference numbers are used in the second embodiment and the first embodiment to refer to the same or like parts.

Figure 6A:
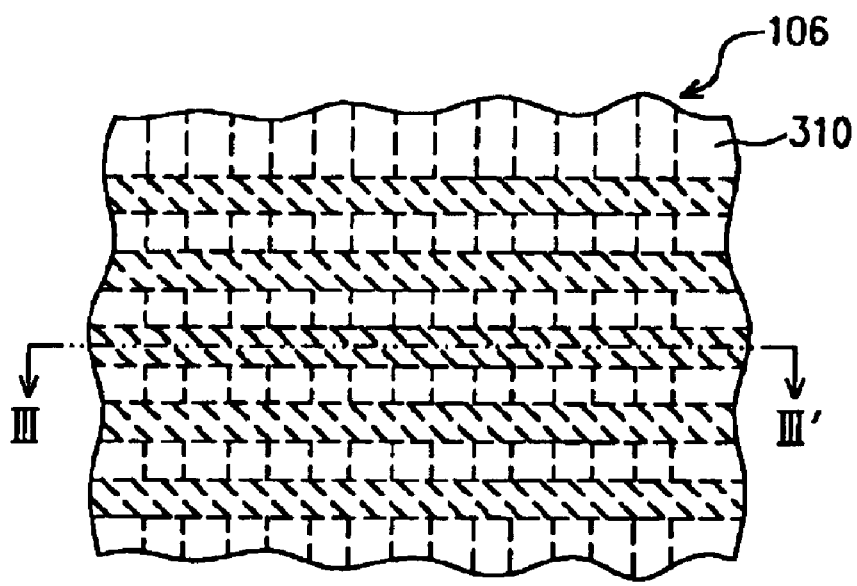
FIGS. 6A to 6D are schematic top views illustrating the process flow for fabricating a mask read only memory device according to the third embodiment of the present invention.

Referring to FIGS. 5A and 6A, a substrate 100 is provided, wherein the substrate 100 is divided into a memory cell region 102 and a periphery circuit region 104. An array of memory cells 106 is already formed in the memory cell region 102, while a plurality of transistors 108 is formed in the periphery circuit region 104. The structures of the array of memory cells 106 and the transistors 108 are same as those in the first embodiment and thus will not further reiterate here. After this, a negative photoresist layer 310 is formed on the substrate 100, wherein the negative photoresist layer 310 is formed by, for example, spin coating.

Figure 6B:
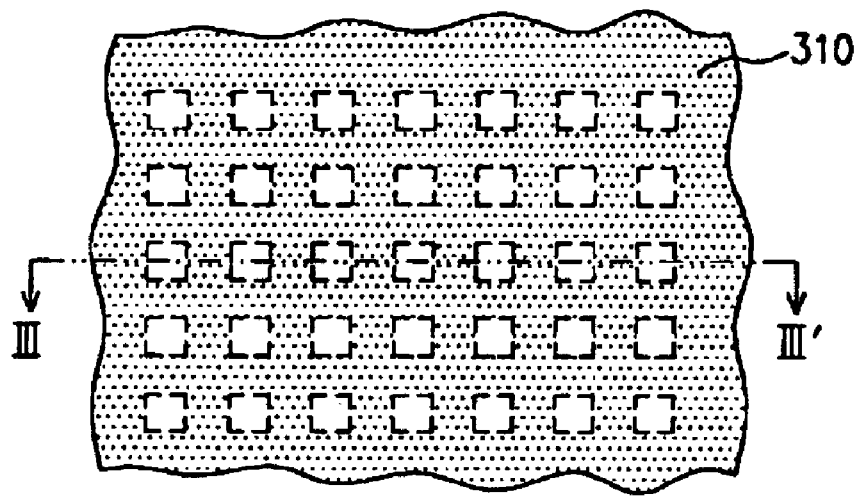

Referring to FIGS. 5B and 6B, an exposure process is conducted to transfer the pattern of the photomask 312 to the negative photoresist layer 310, wherein the photomask 312 is a precise photomask. The photomask 312 in the memory cell region 102 comprises a plurality of patterns having identical critical dimension, wherein these patterns are arranged in a matrix. Thus, the pattern density of the photomask 312 in each region of the memory cell region 102 is identical. Further, the opaque portion of the photomask 312 is located above the channel region 106e of each memory cell of the memory cell array 106. The non-crosslinked portion of the negative photoresist 310 is positioned above the channel region 106e of each memory cell and above the periphery circuit region 104.

Figure 6C:
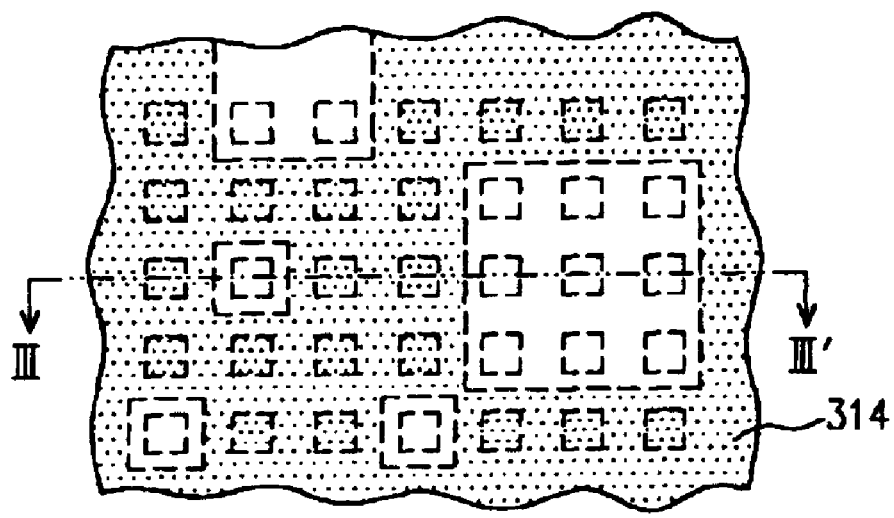

Continuing to FIGS. 5C and 6C, another negative photoresist layer 314 is formed on the substrate 100, wherein the photoresist layer 314 is formed by a spin coating method. An exposure process is then performed to transfer the pattern in the photomask 316 to the negative photoresist layer 314 and the negative photoresist layer 310. The opaque portion of the photomask 316 is located above the pre-coding memory cell region 102a of the memory cell region 102 and above the gates 108a of the transistors 108 in the periphery circuit region 104. Therefore, the non-crosslinked portions of the negative photoresist layer 314 and the negative photoresist layer 310 are positioned above the pre-coding memory cell region 102a of the memory cell region 106 and above the gates 108a of the transistors 108 in the periphery circuit region 104.

Figure 6D:
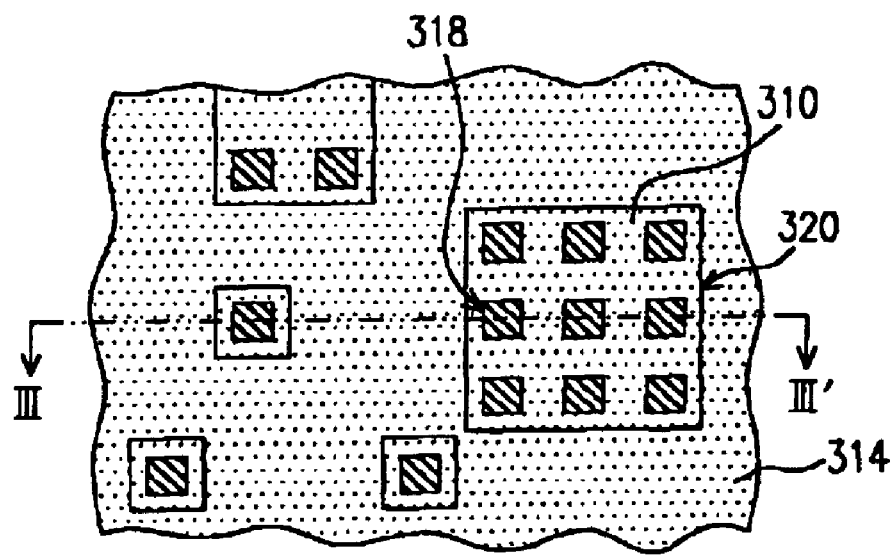

As shown in FIGS. 5D and 6D, a development process is performed to remove the non-crosslinked portions of the photoresist layer 314 and the photoresist layer 310 to form a patterned negative photoresist layer 314 and a patterned negative photoresist layer 310. The patterned photoresist layer 310 in the pre-coding memory cell region 102 comprises a plurality of openings 318, wherein these openings 318 are positioned above the channel region 106e of the pre-coding memory cell and expose the word line 106c of the memory cell. The patterned negative photoresist layer 314 in the memory cell region 102 comprises a plurality of openings 320, wherein these openings 320 expose the pre-coding memory cell region 102a. Further, the patterned negative photoresist layer 314 and the patterned negative photoresist layer 310 in the periphery circuit region 104 comprise a plurality of openings 322, wherein these openings 322 expose the gates 108a of the transistors 108.

An ion implantation step 324 is then performed to code the memory cells by implanting dopants to the channel region 106e underneath the gates 106a in the pre-coding memory cell region of the memory cell region 102. Moreover, the threshold voltage of the transistors 108 in the periphery circuit region 104 is concurrently being adjusted to complete the coding implantation process for the mask read only memory device.

Subsequent to the formation of the negative photoresist layer 310 in the above embodiment of the present invention, the pattern of the precise mask 312 is transferred to the negative photoresist layer 310, wherein the non-crosslinked portion of the negative photoresist layer 310 is positioned above the channel region of each memory cell and above the periphery circuit region 104. Further, after the formation of the negative photoresist layer 314, the pattern of another photomask 316 is then transferred to the negative photoresist layer 314 and the negative photoresist layer 310. Therefore, the opaque portion of the photomask 316 is positioned above the pre-coding memory cell region 102a in the memory cell region 102 and above the gates 108a of the transistors 108 in the periphery circuit region 104. The non-crosslinked portions of the negative photoresist layer 314 and the negative photoresist layer 310 are then removed to form a plurality of openings 318 in the pre-coding memory cell region 102a, wherein the critical dimension of these openings 318 is identical. A plurality of openings 322 is also formed in the periphery circuit region 104 to expose the gates 108a of the transistors 108. The openings 318 are positioned above the channel region 106e of each memory cell in the pre-coding memory cell region 102a, wherein the openings 318 expose the word lines 106c of the memory cell. Since the critical dimension of the openings 318 above the channel region 106e of each memory cell in the pre-coding memory cell region 102a is identical, deviation in the critical dimension of the coding window between the isolated pattern region and the dense pattern region due to the optical proximity effect is prevented, even without the application of the optical proximity correction technique to form the coding mask.

Further, two photomasks are used in the above embodiment. One of the photomasks 312 is a precise mask, wherein the specification is uniform. Although the manufacturing cost for this mask 312 is higher, this mask 312 can be used repeatedly because the precise mask is only used for forming openings with precisely identical critical dimension over the channel region of the memory cell. The other mask 316 that is being used in this embodiment is only required to expose the pre-coding memory cell region in the memory cell region during the coding process. The precision of this mask 316 is not as imperative as that of the conventional coding mask. Consequently, the manufacturing cost for that other mask 316 is lower. Since the conventional coding mask requires the application of the optical proximity correction technique to prevent any inaccuracy in the transferred pattern due to the optical proximity effect, the manufacturing cost for the conventional coding mask is thus very high. In the present invention, the pattern dimension in the dense pattern region and the isolated pattern region is about the same, even without the application of a special patterned photomask formed by the optical proximity correction technique, the manufacturing cost is thus greatly reduced. Further, as the pre-coding memory cell in the memory cell region is being coded, the threshold voltage of the transistors the periphery circuit region is being adjusted concurrently to further simply the manufacturing process.

Additionally, the present invention sequentially performs two exposure processes on the two negative photoresist layers with two layers of the photomask and a single development process to pattern the two negative photoresist layers. Therefore, comparing with the first and the second embodiments, the third embodiment of the present invention provides a more simplified processing procedure to further reduce the manufacturing cost. Moreover, the two negative photoresist layers can be formed into a same photoresist layer. In summary, the present invention simply employs two photoresist layers to improve the deviation in the critical dimension of the coding window between the dense pattern region and the isolated pattern region due to the optical proximity effect.

Fourth Embodiment

FIGS. 7A to 7D are schematic cross-sectional views illustrating the process flow for fabricating a mask read only memory device according to a third embodiment of the present invention. FIGS. 8A to 8D are schematic top views illustrating the process flow for fabricating a mask read only memory device according to the second embodiment of the present invention, wherein the memory cell region in FIGS. 7A to 7D are the cross-sectional views of FIGS. 8A to 8D along the line IV-IV". Wherever possible, the same reference numbers are used in the second embodiment and the first embodiment to refer to the same or like parts.

Figure 8A:
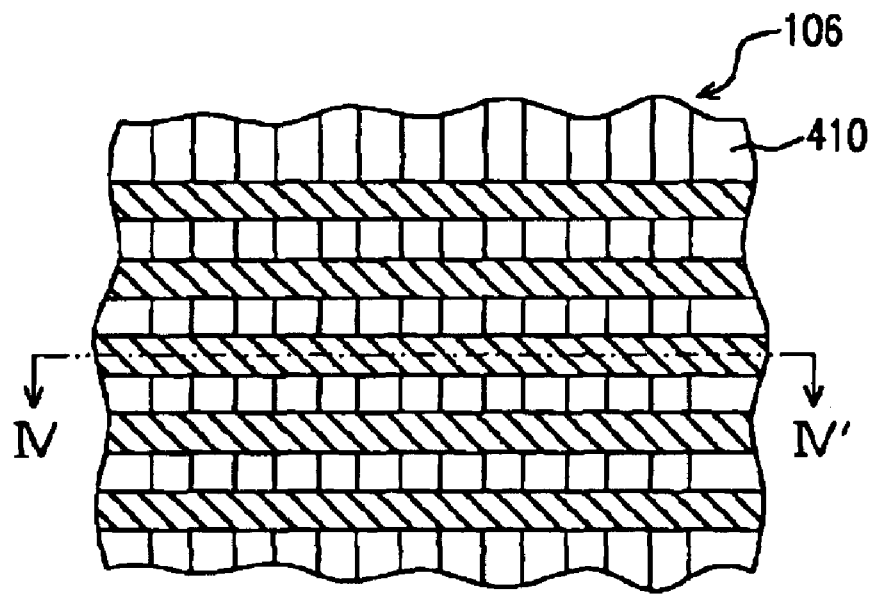
FIGS. 8A to 8D are schematic top views illustrating the process flow for fabricating a mask read only memory device according to the fourth embodiment of the present invention.

Referring to FIGS. 7A and 8A, a substrate 100 is provided, wherein the substrate 100 is divided into a memory cell region 102 and a periphery circuit region 104. An array of memory cells 106 is already formed in the memory cell region 102, while a plurality of transistors is formed in the periphery circuit region 104. The structures of the array of memory cells 106 and the transistors are same as those in the first embodiment and thus will not further reiterate here.

A negative photoresist layer 410 is formed on the substrate 100, wherein the negative photoresist layer 410 is formed by, for example, spin coating.

Figure 8B:
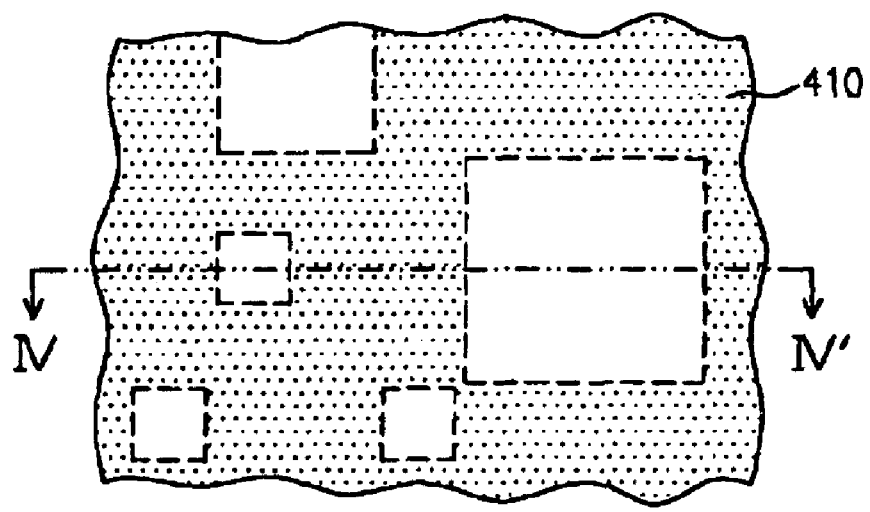

Referring to FIGS. 7B and 8B, an exposure process is conducted to transfer the pattern of the photomask 412 to the negative photoresist layer 410. The opaque portion of the photomask 412 is located above the pre-coding memory cell region 102a in the memory cell region 102 and above the gates 108a of the transistors 108 in the periphery circuit region 104. In other words, the portion of the negative photoresist 410 that are not cross-linked is positioned above the pre-coding memory cell region 102a in the memory cell region 102 and above the gates 108a of the transistors 108 in the periphery circuit region 104.

Figure 8C:
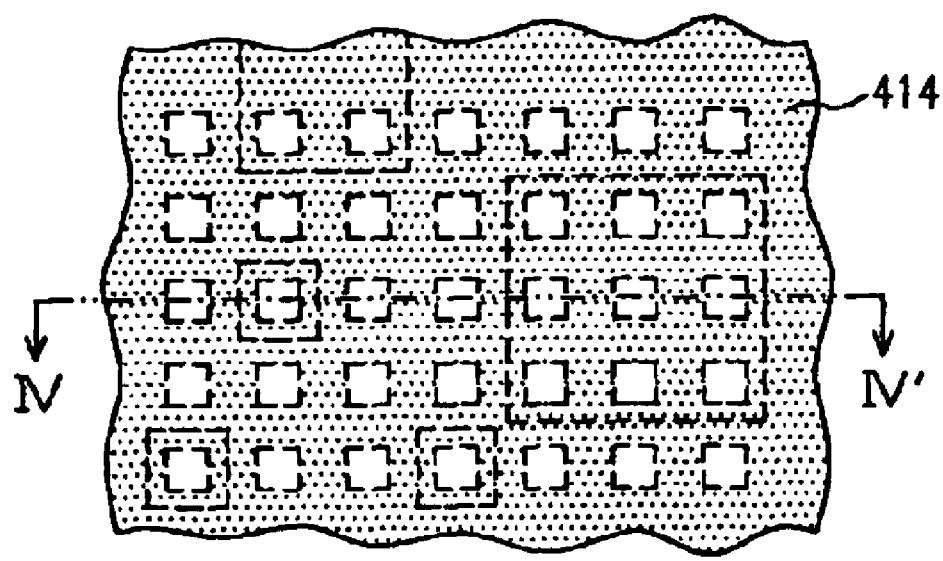

Thereafter, as shown in FIGS. 7C and 8C, another negative photoresist layer 414 is formed on the substrate 100, wherein forming the negative photoresist layer 414 includes the application of the spin-coating method. An exposure process is then conducted to transfer the pattern in the photomask 416 to the negative photoresist layer 414 and to the negative photoresist layer 410. The photomask 416 is, for example, a precise photomask. The photomask 416 comprises a plurality of patterns, wherein the critical dimension of these patterns is identical. Moreover, these patterns are arranged in a matrix. The pattern density in each region of the photomask 416 is about the same. Further, the opaque portion of the photomask 416 is positioned above the channel region 106e of each memory cell in the memory cell region 102a and above the periphery circuit region 104. In other words, the non-crosslinked portion of the negative photoresist layer 414 is positioned above the channel region 106e of each memory cell and above the periphery circuit region 104.

Figure 8D:
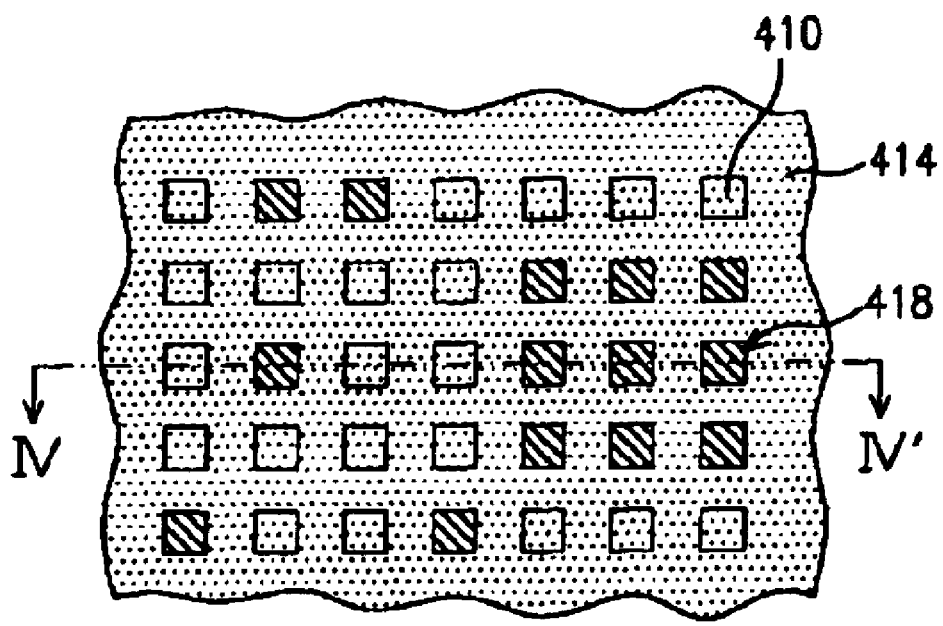

Referring to FIGS. 7D and 8D, a development process is performed to remove the non-crosslinked portion of the negative photoresist layer 414 and the negative photoresist layer 410 to form a patterned negative photoresist layer 414 and a patterned negative photoresist layer 410. The patterned negative photoresist layer 414 and a patterned negative photoresist layer 410 in the pre-coding memory cell region 102a comprise a plurality of openings 418, wherein these openings 418 are positioned above the channel regions 106e of each pre-coding memory cell and expose the word lines 106c of the memory cell. The patterned negative photoresist layer 410 in the periphery circuit region 104 comprises a plurality of openings 420, wherein these openings 420 expose the gates 108a of the transistors 108.

Thereafter, an ion implantation process 422 is performed to code the memory cell by implanting dopants to the channel region 106e of the pre-coding memory cell in the memory cell region 102, using the patterned negative photoresist layer 414 and the patterned negative photoresist layer 410 as a mask. The threshold voltage of the transistors 108 in the periphery circuit region 104 is concurrently being adjusted to complete the code implantation process of the read only memory.

In the above preferred embodiment, subsequent to the formation of the negative photoresist layer 410, the pattern of the photomask 412 is transferred to the photoresist layer 410. The opaque portion of the photomask 412 is positioned above the pre-coding memory cell region 102a in the memory cell region 102 and above the gate 108a of the transistor 108 in the periphery circuit region 104. The non-crosslinked portion of the negative photoresist layer 410 in the memory cell region 102 is positioned above the pre-coding memory cell region 102a, while the non-crosslinked portion of the negative photoresist layer 410 in the periphery circuit region 104 is positioned above the gates 108a of the transistors. After this, another negative photoresist layer 414 is formed. The pattern of the photomask 416 (precise mask) is further transferred to the negative photoresist layer 414 and the negative photoresist layer 410. The non-crosslinked portions of the photoresist layer 414 and the negative photoresist layer 410 are positioned above the channel region 106e of each memory cell. The non-crosslinked portions of the negative photoresist layer 414 and the negative photoresist layer 410 are removed to form a plurality of openings 418 in the pre-coding memory cell region 102 and a plurality of openings 420 in the periphery circuit region 104, wherein the critical dimension of the openings 418 is identical and the openings 420 expose the gates 108a of the transistors 108. The openings 418 are positioned above the channel region 106e of each memory cell in the pre-coding memory cell region 102a and exposes the word line 106c of the memory cell. Since the critical dimension of each opening 418 above the channel region 106e of the pre-coding memory cell in the memory cell region 102 is identical, any deviation in the critical dimension of the coding window between the isolated pattern region and the dense pattern region due to optical proximity effect is prevented, even without application of the optical proximity correction technique in forming the coding photomask.

Further, two photomasks are used in the above embodiment. One of the masks is a precise mask, wherein the specification is uniform. Although the manufacturing cost for this mask 416 is higher, this one mask can be used repeatedly because the precise mask is only used for forming openings above the channel region of the memory cell with precisely identical critical dimensions. The other photomask 412 that is being used in this embodiment is required only to expose the pre-coding memory cell region in the memory cell region during the coding process. The precision of this photomask 412 is not as imperative as that of the conventional coding mask. Consequently, the manufacturing cost for this mask is lower. Since the conventional coding mask requires the application of the optical proximity correction technique to prevent any inaccuracy in the transferred pattern due to the optical proximity effect, the manufacturing cost for the conventional coding mask is thus very high. The pattern dimension in the dense pattern region and in the isolated pattern region is identical in the present invention; therefore, even without the application of a specially patterned photomask formed by the optical proximity correction technique, the manufacturing cost for the present invention is reduced. Further, as the code implantation is being performed to the pre-coding memory cells in the memory cell region, the threshold voltage of the transistors in the periphery circuit region is concurrently being adjusted. The manufacturing process is thus greatly simplified.

Accordingly, the present invention sequentially performs two exposure processes on the two negative photoresist layers with two layers of the photomask and a single development process to pattern the two negative photoresist layers. Therefore, comparing with the first and the second embodiments, the fourth embodiment of the present invention provides a more simplified processing procedure to further reduce the manufacturing cost. Moreover, the two negative photoresist layers can be formed into a same photoresist layer. In summary, the present invention simply employs two photoresist layers to improve the deviation in the critical dimension of the coding window between the dense pattern region and the isolated pattern region due to the optical proximity effect.

Moreover, two mask layers are sequentially formed on the memory cell region of the present invention, wherein one of the mask layers is a precise layer. Another mask layer is used to cover the portion of the unwanted pattern on the precise layer to prevent the unwanted pattern to transfer from the precise layer to the underlying material layer.

Although in the above embodiments, the present invention is described with respect to the fabrication method for a mask read only memory device, it is intended that the present invention also applicable to the etching of conductive material in forming the conductive line, the fabrication of trenches or the fabrication of other types of opening. Additionally, the pattern-transferred layer in the embodiments of the present invention is a hard mask layer.

However, the pattern-transferred layer can be formed with a photoresist material to further simply the manufacturing process and cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for coding a semiconductor device, the method comprising:

providing a substrate, the substrate comprises a coding region and a periphery circuit region, wherein a plurality of coding units are formed in the memory cel region and a plurality of transistors are formed in the periphery circuit region; forming a precise layer on the coding region, the precise layer comprises a plurality of first openings, wherein a critical dimension of the first openings is identical and each of the first openings is disposed above one of the coding units;

forming a mask layer on the substrate over the precise layer, the mask layer comprises a plurality of second openings and a plurality of third openings, wherein the second openings are disposed above a plurality of pre-coding regions and each pre-coding region comprises at least one selected coding unit, and the third openings are disposed above the gates of the transistors in the periphery circuit region; and performing an ion implantation process to code the at least selected coding un and to adjust a threshold voltage of the transistors.

2. The method of claim 1, wherein forming the precise layer an the coding region further comprises:

forming a patterned-transferred layer on the substrate;

forming a photoresist layer on the pattern-transferred layer;

patterning the photoresist layer above the coding region with a precise photomask to form a plurality of fourth openings; and removing the pattern-transferred layer exposed by the fourth openings in the coding region and the pattern-transferred layer in the periphery circuit region to form the precise layer in the memory cell region using the patterned photoresist layer as a mask.

3. The method of claim 1, wherein forming the precise layer includes forming a photoresist layer.

4. The method of claim 1, wherein forming the mask layer includes forming a photoresist layer.

5. A fabrication method for a read only memory device, comprising:

providing a substrate, the substrate comprises a memory cell region and a periphery circuit region, wherein a memory cell array is formed in the memory cell region and a plurality of transistors is formed in the periphery circuit region;

forming a mask layer on the substrate, the mask layer comprises a plurality of first openings and a plurality of second openings, die first openings are disposed over at least one pre-coding memory cell region In the memory cell array, wherein the pre-coding memory cell region comprises at feast one pre-coding memory cell, and the second openings are disposed above the transistor in the periphery circuit region;

forming a precise layer on the memory cell region over the mask layer the precise layer comprises a plurality of third openings, each of the third openings is positioned above one of the pre-coding memory cell In the pre-coding memory cell region; and performing an ion implantation process to code the pre-coding memory cell in the pre-coding memory cell region and to adjust a threshold voltage of the transistor using the mask layer and the precise layer as a mask.

6. The method of claim 5, wherein the forming the mask layer includes forming a photoresist layer.

7. The method of claim 5, wherein forming the mask layer on the substrate comprises:

forming a pattern-transferred layer on the substrate;

forming a photoresist layer on the pattern-transferred layer;

patterning the photoresist layer; and etching the pattern-transferred layer to form the mask layer.

8. The method of claim 5, wherein forming the precise layer on the memory cell region comprises forming a photoresist layer on the substrate.

* * * * *